US011381217B2

(12) United States Patent
Mori et al.

(10) Patent No.: US 11,381,217 B2
(45) Date of Patent: Jul. 5, 2022

(54) RADIO FREQUENCY CIRCUIT, MULTIPLEXER, RADIO FREQUENCY FRONT END CIRCUIT AND COMMUNICATION APPARATUS

(71) Applicant: Murata Manufacturing Co., Ltd., Kyoto (JP)

(72) Inventors: Hirotsugu Mori, Kyoto (JP); Hideki Tsukamoto, Kyoto (JP); Taizo Hisano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 256 days.

(21) Appl. No.: 16/855,006

(22) Filed: Apr. 22, 2020

(65) Prior Publication Data

US 2020/0252042 A1 Aug. 6, 2020

Related U.S. Application Data

(63) Continuation of application No. PCT/JP2018/037869, filed on Oct. 11, 2018.

(30) Foreign Application Priority Data

Oct. 24, 2017 (JP) .............................. JP2017-205569

(51) Int. Cl.
*H03H 7/46* (2006.01)
*H03F 3/19* (2006.01)
(Continued)

(52) U.S. Cl.
CPC ................. *H03H 7/46* (2013.01); *H03F 3/19* (2013.01); *H03H 1/00* (2013.01); *H03H 7/0107* (2013.01);
(Continued)

(58) Field of Classification Search
CPC .......... H03H 7/46; H03H 1/00; H03H 7/0107; H03H 7/0153; H03H 7/075; H03H 9/70;
(Continued)

(56) References Cited

U.S. PATENT DOCUMENTS

2010/0091752 A1 4/2010 Kemmochi et al.
2015/0162888 A1 6/2015 Yunoki et al.
(Continued)

FOREIGN PATENT DOCUMENTS

JP H10294634 A 11/1998
JP 2015-111783 A 6/2015
(Continued)

OTHER PUBLICATIONS

International Search Report for International Application No. PCT/JP2018/037869, dated Jan. 8, 2019.
(Continued)

*Primary Examiner* — Hafizur Rahman
(74) *Attorney, Agent, or Firm* — Pearne & Gordon LLP

(57) ABSTRACT

A radio frequency circuit includes a multilayer substrate, series arm circuits in a first path connecting the input/output terminals (T1 and T2) on the multilayer substrate, a parallel arm circuit in a second path connecting a node on the first path and a ground, a wiring A on the multilayer substrate connected to the input/output terminal (T1) as a part of the first path, a wiring B on the multilayer substrate connected to the input/output terminal (T2) as a part of the first path, and a wiring C on the multilayer substrate as a part of the second path. The parallel arm circuit includes an impedance variable circuit, the wiring A and the wiring B in a layer different from the multilayer substrate. When viewed in a plan view, the wiring C does not overlap with the wiring A and the wiring B.

10 Claims, 20 Drawing Sheets

(51) Int. Cl.
*H03H 1/00* (2006.01)
*H03H 7/01* (2006.01)
*H03H 7/075* (2006.01)
*H03H 9/70* (2006.01)
*H04J 1/02* (2006.01)

(52) U.S. Cl.
CPC .......... *H03H 7/0153* (2013.01); *H03H 7/075* (2013.01); *H03H 9/70* (2013.01); *H04J 1/02* (2013.01); *H03F 2200/165* (2013.01); *H03F 2200/171* (2013.01); *H03F 2200/451* (2013.01); *H03H 2001/0085* (2013.01)

(58) Field of Classification Search
CPC .............. H03H 2001/0085; H03F 3/19; H03F 2200/165; H03F 2200/171; H03F 2200/451; H04J 1/02
USPC ........................................................ 370/343
See application file for complete search history.

(56) References Cited

U.S. PATENT DOCUMENTS

2015/0271916 A1  9/2015 Harada
2019/0214969 A1* 7/2019 Wada ................... H03H 9/6403

FOREIGN PATENT DOCUMENTS

JP        5773096 B1     9/2015
WO     2008075691 A1    6/2008

OTHER PUBLICATIONS

Written Opinion for International Application No. PCT/JP2018/037869, dated Jan. 8, 2019.

* cited by examiner

RADIO FREQUENCY CIRCUIT, MULTIPLEXER, RADIO FREQUENCY FRONT END CIRCUIT AND COMMUNICATION APPARATUS

This is a continuation of International Application No. PCT/JP2018/037869 filed on Oct. 11, 2018 which claims priority from Japanese Patent Application No. 2017-205569 filed on Oct. 24, 2017. The contents of these applications are incorporated herein by reference in their entireties.

BACKGROUND

Technical Field

The present disclosure relates to a radio frequency circuit, a multiplexer, a radio frequency front end circuit and a communication apparatus.

In recent mobile communication terminals, there has been a demand to handle a plurality of frequency bands using one terminal, so-called multiband capability, and the multiband capability is also required for a front end circuit for transmitting a radio frequency signal in the mobile communication terminal. As such, in order to secure the signal quality of each frequency band, a filter for varying a bandpass characteristic in accordance with the selection of the frequency band is required in the front end circuit.

Patent Document 1 discloses a radio frequency module having two series circuits arranged in a path connecting a first input/output terminal and a second input/output terminal, and a parallel circuit arranged between a node on the path and a ground. Each of the two series circuits and the parallel circuit includes a passive element and a variable capacitance element. By varying the variable capacitance elements of the series circuit and the parallel circuit, impedance matching is performed according to the used band, thereby realizing a radio frequency module having a variable filter excellent in a bandpass characteristic.

Patent Document 1: Japanese Patent No. 5773096

BRIEF SUMMARY

However, in the radio frequency module disclosed in Patent Document 1, when a first wiring connecting a first input/output terminal and a first series circuit or a wiring connecting a second input/output terminal and a second series circuit and a wiring connected to a variable capacitance element of a parallel circuit are close, an unnecessary electromagnetic field coupling is generated between both wirings. In this case, there is a problem that a transmission characteristic of the radio frequency signal passing between the first input/output terminal and the second input/output terminal deteriorate.

Accordingly, the present disclosure provides a bandpass characteristic variable radio frequency circuit excellent in transmission characteristic, a multiplexer, a radio frequency front end circuit, and a communication apparatus.

A radio frequency circuit according to an aspect of the present disclosure includes a multilayer substrate, a first input/output terminal and a second input/output terminal formed on a surface of the multilayer substrate, a first series arm circuit and a second series arm circuit which are formed in the multilayer substrate and which are arranged in series in a first path connecting the first input/output terminal and the second input/output terminal, a parallel arm circuit arranged in a second path connecting a node on the first path and the ground, a first wiring formed in the multilayer substrate and connected to the first input/output terminal to configure a part of the first path, a second wiring formed in the multilayer substrate and connected to the second input/output terminal to configure a part of the first path, and a third wiring formed in the multilayer substrate to configure a part of the second path, in which the parallel arm circuit includes a first impedance variable circuit for varying a transmission characteristic of a radio frequency signal between the first input/output terminal and the second input/output terminal, the first wiring and the second wiring are formed in a layer different from a layer of the multilayer substrate in which the third wiring is formed, and when the multilayer substrate is viewed in a plan view, the third wiring does not overlap with the first wiring and the second wiring.

According to the above configuration, since the first wiring and the second wiring which configure the first path and the third wiring which configures the second path are formed in different layers of the multilayer substrate and are arranged so as not to overlap with each other in the above plan view, it is possible to suppress an occurrence of unnecessary electromagnetic field coupling between the first wiring and the second wiring and the third wiring. As a result, in the above-described radio frequency circuit, occurrence of an unintended impedance change can be suppressed, so that a low transmission loss in a pass band and a high attenuation in an attenuation band can be secured. Therefore, it is possible to provide a bandpass characteristic variable radio frequency circuit excellent in a transmission characteristic.

Additionally, the first impedance variable circuit is configured by, for example, a switch element having on-resistance, a variable capacitor having a low Q value, and the like, but the first impedance variable circuit is arranged in the parallel arm circuit. Therefore, it is possible to suppress deterioration of the transmission loss in the first path in which the series arm circuit is arranged due to the influence of on-resistance of the first impedance variable circuit and Q value reduction of the capacitor.

Further, the parallel arm circuit may include an LC series resonance circuit configured by an inductor and a capacitor connected in series between the node and the ground.

As a result, the presence or absence of a resonance point generated by the LC series resonance circuit and a frequency change in the resonance point are made possible. Therefore, since the presence or absence of an attenuation pole, the frequency of the attenuation pole can be varied in the bandpass characteristic of the above radio frequency circuit, it becomes possible to change (1) a frequency of the pass band of the above radio frequency circuit, (2) steepness of the pass band of the above radio frequency circuit, and (3) a frequency of the attenuation band of the above radio frequency circuit.

Further, the parallel arm circuit may include an acoustic wave resonator arranged between the node and the ground.

As a result, the presence or absence of the resonance point generated by the parallel arm circuit, and the frequency change in the resonance point are made possible. Therefore, since the presence or absence of an attenuation pole, the frequency of the attenuation pole can be varied in the bandpass characteristic of the above radio frequency circuit, it becomes possible to change (1) a frequency of the pass band of the above radio frequency circuit, (2) steepness of the pass band of the above radio frequency circuit, and (3) a frequency of the attenuation band of the above radio frequency circuit.

Further, the multilayer substrate may have a first main surface and a second main surface facing back-to-back, the first impedance variable circuit may include a variable element which is a switch element or a variable capacitor, the variable element may be formed on the first main surface, and the first input/output terminal and the second input/output terminal may be formed on the second main surface.

Thus, the first wiring and the second wiring which are connected to the first input/output terminal or the second input/output terminal are arranged on the second main surface side of the multilayer substrate, and the third wiring which is arranged in the second path where the first impedance variable circuit is arranged can be arranged on the first main surface side of the multilayer substrate. Therefore, even if the first wiring and the second wiring and the third wiring are arranged in different layers, a wiring length of each wiring can be shortened, so that transmission loss of the radio frequency circuit can be reduced.

Additionally, since the variable element configuring the first impedance variable circuit is formed on the first main surface, the variable element can be configured by a surface mount type element. Therefore, in the case where the variable element is a switch element, the on-resistance can be reduced, and in the case where the variable element is a variable capacitor, the Q value can be increased. This makes it possible to improve the bandpass characteristic of the radio frequency circuit.

Further, the first wiring connects the first input/output terminal to the first series arm circuit, the second wiring connects the second input/output terminal to the second series arm circuit, and the first series arm circuit, the second series arm circuit, and the parallel arm circuit each includes one or more capacitors, and in the plan view, the one or more capacitors included in the first series arm circuit and the one or more capacitors included in the second series arm circuit may not overlap with the one or more capacitors included in the parallel arm circuit.

According to the above configuration, since the capacitors configuring the first series arm circuit and the second series arm circuit and the capacitors configuring the parallel arm circuit are arranged so as not to overlap with each other in the plan view, it is possible to suppress generation of unnecessary parasitic capacitance between the first series arm circuit and the second series arm circuit and the parallel arm circuit. As a result, in the above-described radio frequency circuit, the occurrence of an unintended impedance change can be suppressed, so that low transmission loss in a pass band and a high attenuation in an attenuation band can be secured.

Further, a multiplexer, according to an aspect of the present disclosure, is capable of simultaneously transmitting a radio frequency signal of one of a first frequency band and a second frequency band belonging to a first frequency band group and a radio frequency signal of a third frequency band belonging to a second frequency band group, and exclusively transmits a radio frequency signal of the first frequency band and a radio frequency signal of the second frequency band, and includes a first common terminal, a third input/output terminal, and a fourth input/output terminal, a first filter constituted of the radio frequency circuit according to Claims 1 to 4, in which the first common terminal is connected to the first input/output terminal, the third input/output terminal is connected to the second input/output terminal, a frequency range of the first frequency band group is set as a pass band, and a frequency range of the second frequency band group is set as an attenuation band, and a second filter arranged between the first common terminal and the fourth input/output terminal, having a frequency range of the second frequency band group as a pass band, and having a frequency range of the first frequency band group as an attenuation band, in which the first filter includes the first impedance variable circuit having a first switch element, and at least one of a pass band and an attenuation band of the first filter is varied by an impedance change of the first impedance variable circuit.

For example, in (1) a case where the first frequency band belonging to the first frequency band group and the third frequency band belonging to the second frequency band group are simultaneously used, and (2) a case where the second frequency band belonging to the first frequency band group and the third frequency band belonging to the second frequency band group are simultaneously used, frequency intervals of two frequency bands to be simultaneously used are different.

According to the above configuration, since at least one of the pass band and the attenuation band of the first filter is varied while maintaining low loss and high attenuation by an impedance change of the first impedance variable circuit, for example, in (1) a case where the frequency interval between two frequency bands used simultaneously is small, it is possible to suppress deterioration of the insertion loss on the pass band side of the second filter in the pass band of the first filter by making the pass band of the first filter close to the pass band of the second filter. Additionally, for example, in (2) a case where the frequency interval between two frequency bands used simultaneously is large, it is possible to improve isolation of the first filter and the second filter by making the attenuation band of the first filter located between the pass band of the first filter and the pass band of the second filter close to the pass band of the first filter.

Therefore, even when the frequency band to be selected is changed in the multiplexer for performing carrier aggregation (CA) between the so-called first frequency band group and the second frequency band group, deterioration of insertion loss or a demultiplexing characteristic can be suppressed.

Further, the first frequency band group includes the first frequency band and the second frequency band, the second frequency band group includes the third frequency band and the fourth frequency band, the multiplexer is capable of (1) exclusively transmitting a radio frequency signal of the first frequency band and a radio frequency signal of the second frequency band, (2) exclusively transmitting a radio frequency signal of the third frequency band and a radio frequency signal of the fourth frequency band, and (3) capable of simultaneously transmitting a radio frequency signal of one of the first frequency band and the second frequency band and a radio frequency signal of one of the third frequency band and the fourth frequency band, the second filter includes a second impedance variable circuit for varying a transmission characteristic of a radio frequency signal between the first common terminal and the fourth input/output terminal, and at least one of a pass band and an attenuation band of the second filter may be variable by an impedance change of the second impedance variable circuit.

For example, in (1) a case where the third frequency band belonging to the second frequency band group and the first frequency band belonging to the first frequency band group are simultaneously used, and (2) a case where the fourth frequency band belonging to the second frequency band group and the first frequency band belonging to the first frequency band group are simultaneously used, frequency intervals of two frequency bands to be simultaneously used are different.

According to the above configuration, since at least one of the pass band and the attenuation band of the second filter is varied while maintaining low loss and high attenuation by the impedance change of the second impedance variable circuit, for example, in (1) a case where the frequency interval between two frequency bands used simultaneously is small, it is possible to suppress deterioration of the insertion loss on the pass band side of the first filter in the pass band of the second filter by making the pass band of the second filter close to the pass band of the first filter. In addition, for example, in (2) a case where the frequency interval between two frequency bands to be simultaneously used is large, it is possible to improve isolation of the first filter and the second filter by making the attenuation band of the second filter located between the pass band of the second filter and the pass band of the first filter close to the pass band of the second filter.

Further, by setting both the first filter and the second filter to be variable in frequency, the pass band and the attenuation band of the first filter and the second filter can be optimized even in the case where any combination is selected in the CA using any one of the first frequency band and the second frequency band and any one of the third frequency band and the fourth frequency band.

Therefore, in the multiplexer for performing the CA between the so-called first frequency band group and the second frequency band group, even when the frequency band to be selected is changed, deterioration of the insertion loss or the isolation can be suppressed.

Further, a radio frequency front end circuit according to an aspect of the present disclosure includes the multiplexer above described, a third switch having a second common terminal, a first selection terminal, and a second selection terminal, the second common terminal being connected to the third input/output terminal, a third filter connected to the first selection terminal and having the first frequency band as a pass band, a fourth filter connected to the second selection terminal and having the second frequency band as a pass band, a fifth filter connected to the fourth input/output terminal and having the third frequency band as a pass band, a first amplifier circuit connected to the third filter and the fourth filter, and a second amplifier circuit connected to the fifth filter.

Further, a radio frequency front end circuit according to an aspect of the present disclosure includes the multiplexer described above, a fourth switch having a third common terminal, a third selection terminal, and a fourth selection terminal, the third common terminal being connected to the fourth input/output terminal, a third filter connected to the first selection terminal and having the first frequency band as a pass band, a fourth filter connected to the second selection terminal and having the second frequency band as a pass band, a fifth filter connected to the third selection terminal and having the third frequency band as a pass band, a sixth filter connected to the fourth selection terminal and having the fourth frequency band as a pass band, a first amplifier circuit connected to the third filter and the fourth filter, and a second amplifier circuit connected to the fifth filter and the sixth filter.

As a result, in the above-described radio frequency circuit, the occurrence of an unintended impedance change can be suppressed, so that it is possible to provide a radio frequency front end circuit in which a low transmission loss in the pass band and a high attenuation in the attenuation band are secured.

Further, a communication apparatus according to an aspect of the present disclosure includes an RF signal processing circuit for processing a radio frequency signal received by an antenna element, and the above-described radio frequency front end circuit for transmitting the radio frequency signal between the antenna element and the RF signal processing circuit.

As such, in the above-described radio frequency circuit, the occurrence of an unintended impedance change can be suppressed, so that it is possible to provide a communication apparatus in which a low transmission loss in the pass band and a high attenuation in the attenuation band are secured.

According to the present disclosure, it is possible to provide a bandpass characteristic variable radio frequency circuit excellent in a transmission characteristic, a multiplexer, a radio frequency front end circuit and a communication apparatus.

DETAILED DESCRIPTION

Figure 1A:
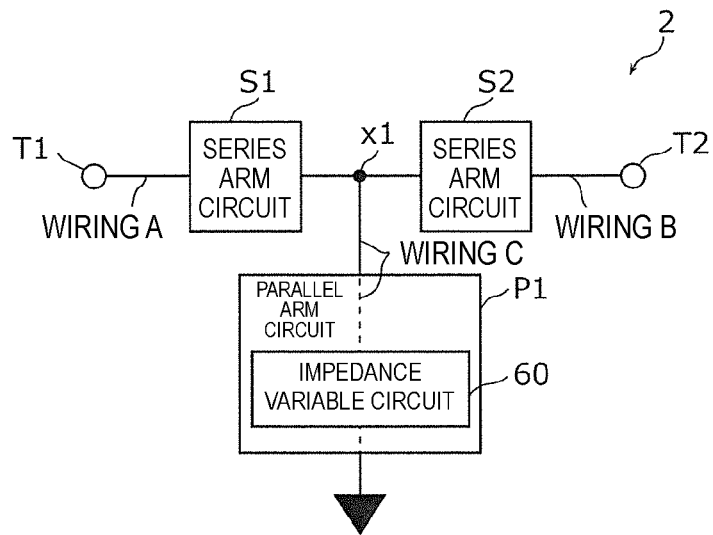
FIG. 1A is a circuit configuration diagram of a radio frequency circuit according to a first embodiment.

Hereinafter, embodiments of the present disclosure will be described in detail with reference to examples, modifications and drawings. Note that the examples and modifications described below are intended to be comprehensive or specific examples. Numerical values, shapes, materials, constituent elements, arrangement and connection forms of the constituent elements, and the like, which will be described in the following examples and modifications are merely examples and are not intended to limit the present disclosure. Among the constituent elements in the following examples and modifications, constituent elements not described in the independent claims will be described as arbitrary constituent elements. Also, sizes or size ratios of the constituent elements illustrated in the drawings are not necessarily strictly illustrated.

First Embodiment

[1.1 Configuration of Radio Frequency Circuit]

FIG. 1A is a circuit configuration diagram of a radio frequency circuit 2 according to the first embodiment. The radio frequency circuit 2 illustrated in the figure includes input/output terminals T1 and T2, series arm circuits S1 and S2, and a parallel arm circuit P1.

The series arm circuit S1 is a first series arm circuit arranged in a first path connecting the input/output terminal T1 (first input/output terminal) and the input/output terminal T2 (second input/output terminal). In addition, the series arm circuit S2 is a second series arm circuit arranged in the first path connecting the input/output terminal T1 and the input/output terminal T2. The series arm circuit S1 and the series arm circuit S2 are arranged in series in the first path, and are configured by passive elements such as inductors and capacitors.

The parallel arm circuit P1 is arranged in a second path connecting a node x1 and the ground on the first path. The parallel arm circuit P1 includes an impedance variable circuit 60. The impedance variable circuit 60 is a first impedance variable circuit which varies a transmission characteristic of the radio frequency signal between the input/output terminal T1 and the input/output terminal T2.

The radio frequency circuit 2 further includes a wiring A (first wiring) which is connected to the input/output terminal T1 and configures a part (one end portion region) of the first path, a wiring B (second wiring) which is connected to the input/output terminal T2 and configures a part of the first path (another end portion region), and a wiring C (third wiring) which configures a part (partial region) of the second path. More specifically, the wiring C is an internal wiring of the impedance variable circuit 60 or a wiring connected to the impedance variable circuit 60.

Here, the wiring A, the wiring B, and the wiring C are formed in a multilayer substrate formed by laminating a plurality of dielectric layers, and the wiring A and the wiring B are formed in a dielectric layer different from a dielectric layer on which the wiring C is formed, and when the multilayer substrate is viewed in a plan view, the wiring A and the wiring B do not overlap with the wiring C.

According to the above configuration, since the wiring A and the wiring B configuring the first path and the wiring C configuring the second path are formed in another layer of the multilayer substrate and are arranged so as not to overlap with each other when the multilayer substrate is viewed in a plan view, it is possible to suppress an occurrence of unnecessary electromagnetic field coupling between the wiring A and the wiring B and the wiring C. Whereby, in the radio frequency circuit 2, occurrence of an unintended impedance change can be suppressed, so that a low transmission loss in a pass band and a high attenuation in an attenuation band can be secured. Therefore, it is possible to provide the bandpass characteristic variable radio frequency circuit 2 excellent in a transmission characteristic.

Note that the term "electromagnetic field coupling" as used herein is defined to include (1) coupling between an electric field formed by one wiring and an electric field formed by another wiring, (2) coupling between a magnetic field formed by one wiring and a magnetic field formed by another wiring, and (3) coupling between an electromagnetic field formed by one wiring and an electromagnetic field formed by another wiring.

Figure 1B:
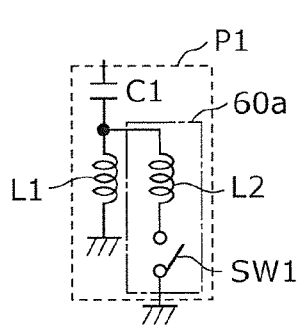
FIGS. 1BA, 1BB, 1BC, 1BD, 1BE, and 1BF are diagrams illustrating examples of a circuit configuration of a parallel arm circuit included in the radio frequency circuit according to the first embodiment.
Figure 1B:
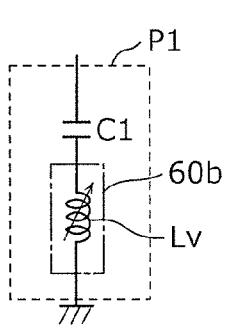
Figure 1B:
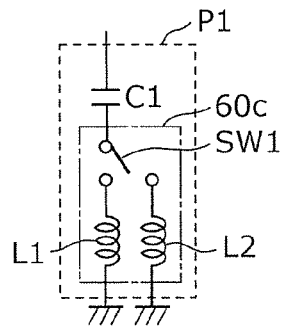
Figure 1B:
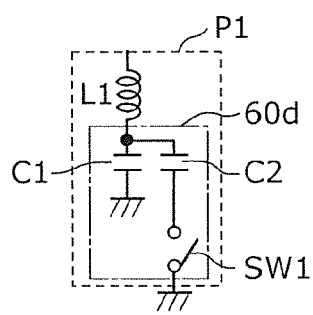
Figure 1B:
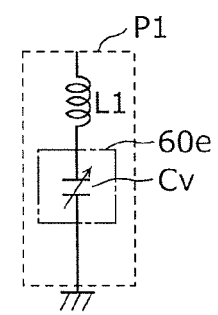
Figure 1B:
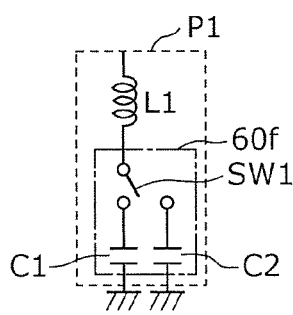

FIGS. 1BA-1BF are diagrams illustrating examples of a circuit configuration of the parallel arm circuit P1 included in the radio frequency circuit 2 according to the first embodiment.

The parallel arm circuit P1 illustrated in FIG. 1BA includes a capacitor C1, inductors L1 and L2, and a switch SW1. The capacitor C1 and the inductor L1 are connected in series between the node x1 and the ground to configure an LC series resonance circuit. The inductor L2 and the switch SW1 are connected in series between a connection node between the capacitor C1 and the inductor L1 and the ground, and configure an impedance variable circuit 60a. According to this configuration, a resonant frequency of the parallel arm circuit P1 is varied by switching the switch SW1 between a conduction (ON) state and a non-conduction (OFF) state. In other words, by switching the switch SW1 in an ON state and an OFF state, impedance of the parallel arm circuit P1 is varied.

Note that the "LC series resonance circuit" used herein is a circuit having inductors and capacitors connected in series with each other, and is defined as a circuit in which resonance defined by inductance of the inductor and capacitance of the capacitor is generated. In addition, the inductor and the capacitor include not only chip components such as SMDs, but also those configured by a planar coil in a multilayer substrate, and those configured by a counter electrode and a dielectric in a multilayer substrate. Also, when a circuit element such as a switch is connected to a connection node between the capacitor and the inductor, the circuit element is included in the LC series resonance circuit.

The parallel arm circuit P1 illustrated in FIG. 1BB includes the capacitor C1 and a variable inductor Lv. The capacitor C1 and the variable inductor Lv are connected in series between the node x1 and the ground to configure an LC series resonance circuit. The variable inductor Lv configures an impedance variable circuit 60b. According to this configuration, the resonant frequency of the parallel arm circuit P1 is varied by varying an inductance value of the variable inductor Lv. In other words, by varying the inductance value of the variable inductor Lv, the impedance of the parallel arm circuit P1 is varied.

The parallel arm circuit P1 illustrated in FIG. 1BC includes the capacitor C1, the inductors L1 and L2, and the switch SW1. The capacitor C1, the switch SW1, and the inductor L1 are connected in series in this order between the node x1 and the ground. Further, the capacitor C1, the switch SW1, and the inductor L2 are connected in series in this order between the node x1 and the ground, and the capacitor C1 and the inductor L1 or L2 configure an LC series resonance circuit by conduction of the switch SW1. The inductors L1 and L2 and the switch SW1 configure an impedance variable circuit 60c. According to this configuration, the resonant frequency of the parallel arm circuit P1 is varied by switching a conduction state of the switch SW1. In other words, by switching the conduction state of the switch SW1, the impedance of the parallel arm circuit P1 is varied.

The parallel arm circuit P1 illustrated in FIG. 1BD includes the inductor L1, the capacitor C1 and a capacitor C2, and the switch SW1. The inductor L1 and the capacitor C1 are connected in series between the node x1 and the ground, and configure an LC series resonance circuit. The capacitor C2 and the switch SW1 are connected in series between a connection node between the inductor L1 and the capacitor C1 and the ground, and configure an impedance variable circuit 60d. According to this configuration, the resonant frequency of the parallel arm circuit P1 is varied by switching the switch SW1 between the ON state and the OFF state. In other words, by switching the switch SW1 in the ON state and the OFF state, impedance of the parallel arm circuit P1 is varied.

The parallel arm circuit P1 illustrated in FIG. 1BE includes the inductor L1 and a variable capacitor Cv. The inductor L1 and the variable capacitor Cv are connected in series between the node x1 and the ground to configure an LC series resonance circuit. The variable capacitor Cv configures an impedance variable circuit 60e. According to this configuration, the resonant frequency of the parallel arm circuit P1 is varied by varying a capacitance value of the variable capacitor Cv. In other words, by varying the capacitance value of the variable capacitor Cv, the impedance of the parallel arm circuit P1 is varied.

The parallel arm circuit P1 illustrated in FIG. 1BF includes the inductor L1, the capacitors C1 and C2, and the switch SW1. The inductor L1, the switch SW1, and the capacitor C1 are connected in series in this order between the node x1 and the ground. The inductor L1, the switch SW1, and the capacitor C2 are connected in series in this order between the node x1 and the ground, and the inductor L1 and the capacitor C1 or C2 configure an LC series resonance circuit by the conduction of the switch SW1. The capacitors C1 and C2 and the switch SW1 configure an impedance variable circuit 60f. According to this configuration, the resonant frequency of the parallel arm circuit P1 is varied by switching a conduction state of the switch SW1. In other words, by switching the conduction state of the switch SW1, the impedance of the parallel arm circuit P1 is varied.

Note that the parallel arm circuit P1 according to the present embodiment is not limited to the circuit configuration illustrated in FIGS. 1BA-1BF. As long as the parallel arm circuit P1 is a circuit including an impedance variable circuit for varying a transmission characteristic of the radio frequency signal between the input/output terminal T1 and the input/output terminal T2, the circuit configuration of the parallel arm circuit P1 is arbitrary.

Like the impedance variable circuits 60a to 60f described above, the impedance variable circuit 60 is configured by, for example, the switch SW1, the variable capacitor Cv, and the variable inductor Lv, but the impedance variable circuit 60 is arranged in the parallel arm circuit P1. Therefore, transmission loss of the first path in which the series arm circuits S1 and S2 are arranged can be suppressed from deteriorating due to on-resistance caused by the switch SW1 of the impedance variable circuit 60 and the influence of Q value reduction due to the variable capacitor and the variable inductor.

Figure 1C:
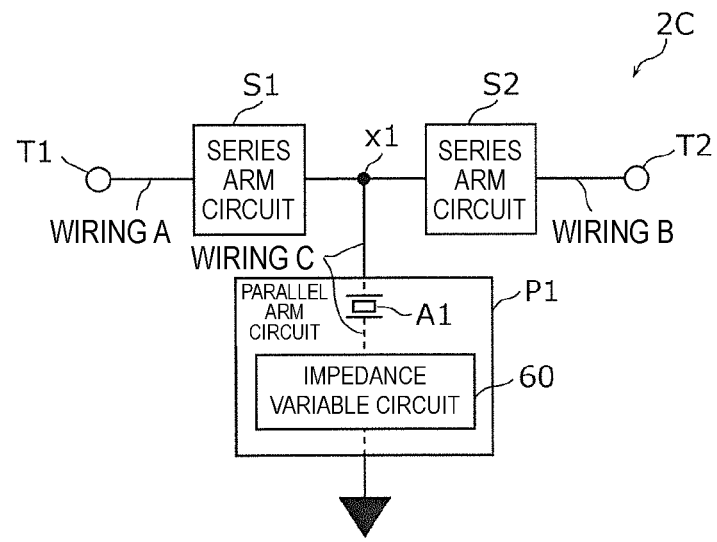
FIG. 1C is a diagram illustrating a circuit configuration example of a parallel arm circuit included in a radio frequency circuit according to a modification of the first embodiment.

FIG. 1C is a diagram illustrating an example of a circuit configuration of the parallel arm circuit P1 included in a radio frequency circuit 2C according to a modification of the first embodiment.

The parallel arm circuit P1 illustrated in this figure includes an acoustic wave resonator A1 and the impedance variable circuit 60. The acoustic wave resonator A1 and the impedance variable circuit 60 are connected in series between the node x1 and the ground.

In the impedance variable circuit 60 of the radio frequency circuit 2C, for example, the impedance variable circuits 60a to 60f illustrated in FIGS. 1BA-1BF are applied, and an inductor, a capacitor, a switch, and the like are included and may be connected in series or in parallel.

According to the above-described configuration of this modification, since the wiring A and the wiring B configuring the first path and the wiring C configuring the second path are arranged in different layers and are arranged so as not to overlap with each other when the multilayer substrate is viewed in a plan view, it is possible to suppress an occurrence of unnecessary electromagnetic field coupling between the wiring A and the wiring B and the wiring C. Accordingly, in the radio frequency circuit 2C, the occurrence of an unintended impedance change can be suppressed, so that low transmission loss in a pass band and a high attenuation in an attenuation band can be secured. Accordingly, it is possible to provide the bandpass characteristic variable radio frequency circuit 2C excellent in a transmission characteristic.

Figure 2A:
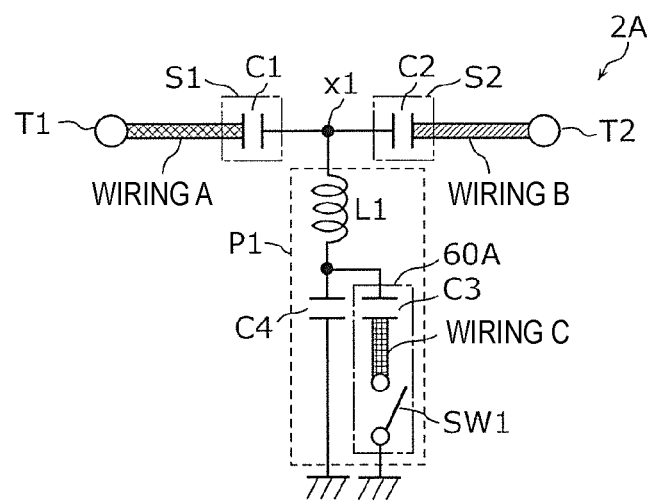
FIG. 2A is a circuit configuration diagram of a radio frequency circuit according to a first example.

FIG. 2A is a circuit configuration diagram of a radio frequency circuit 2A according to the first example. The radio frequency circuit 2A illustrated in this figure is a specific circuit configuration example of the radio frequency circuit 2 according to the first embodiment, and includes the input/output terminals T1 and T2, the series arm circuits S1 and S2, and the parallel arm circuit P1. Hereinafter, the radio frequency circuit 2A according to the first example will be described with a focus on a configuration not described in the description of the radio frequency circuit 2 according to the first embodiment.

The series arm circuit S1 includes the capacitor C1 which is arranged in series in the first path. The series arm circuit S2 includes the capacitor C2 which is arranged in series in the first path.

The parallel arm circuit P1 includes the inductor L1, capacitors C3 and C4, and the switch SW1. The inductor L1 and the capacitor C4 are connected in series between the node x1 and the ground, and configure an LC series resonance circuit. The capacitor C3 and the switch SW1 are connected in series between a connection node between the inductor L1 and the capacitor C4 and the ground, and configure an impedance variable circuit 60A. The parallel arm circuit P1 of this example has a circuit configuration similar to that of the parallel arm circuit P1 illustrated in FIG. 1BD. According to this configuration, the resonant frequency of the parallel arm circuit P1 is varied by switching the switch SW1 between the ON state and the OFF state. In other words, by switching the switch SW1 in the ON state and the OFF state, impedance of the parallel arm circuit P1 is varied.

The radio frequency circuit 2A further includes the wiring A (first wiring) which is connected to the input/output terminal T1 and the capacitor C1 and configures one end portion region of the first path, the wiring B (second wiring) which is connected to the input/output terminal T2 and the capacitor C2 and configures another end portion region of the first path, and the wiring C (third wiring) which is connected to the capacitor C3 and the switch SW1 and configures a partial region of the second path.

Figure 2B:
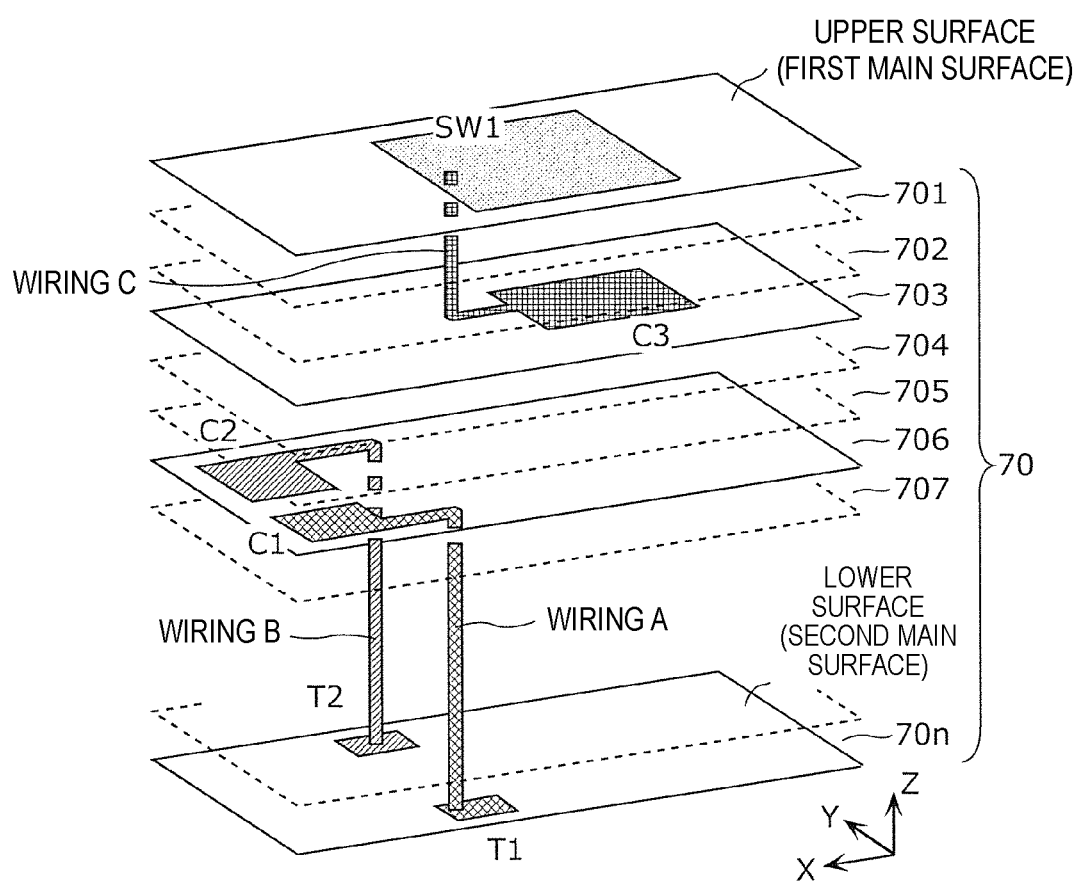
FIG. 2B is a perspective view illustrating a mounting structure of the radio frequency circuit according to the first example.

FIG. 2B is a perspective view illustrating a mounting structure of the radio frequency circuit 2A according to the first example. In this figure, an arrangement relationship between each of the circuit elements and wirings which are formed in a multilayer substrate 70 to configure the radio frequency circuit 2A is illustrated.

The multilayer substrate 70 is a multilayer body in which a plurality of (n layers: n is an integer equal to or greater than 2) dielectric layers 701 to 70n each having a conductor pattern formed thereon are stacked in a direction perpendicular to a main surface of the multilayer substrate 70 (Z-axis direction in FIG. 2B). In the dielectric layers 701 to 70 (n−1), the conductor pattern is formed on a surface on a Z-axis positive direction side of two surfaces facing back-to-back of each layer, and in the dielectric layer 70n, the conductor pattern is formed on both sides of two surfaces facing back-to-back.

The switch SW1 is formed in the dielectric layer 701 and is formed on an upper surface (first main surface) of the multilayer substrate 70. The capacitor C3 is formed in the dielectric layer 704. Thus, the wiring C is formed in the dielectric layers 701 to 704. The dielectric layer 704 is a layer lower than the dielectric layer 701 and upper than the dielectric layer 70n. Note that the capacitor C3 is not limited to being formed in the dielectric layer 704, and may be formed in a layer lower than the dielectric layer 701 and upper than the dielectric layer 70n.

The input/output terminals T1 and T2 are formed in the dielectric layer 70n, and are formed on a lower surface (a second main surface) of the multilayer substrate 70. The capacitors C1 and C2 are formed in the dielectric layer 707. Thus, the wiring A and the wiring B are formed in the dielectric layers 707 to 70n. That is, the wiring A and the wiring B and the wiring C are formed in different layers.

Furthermore, when the multilayer substrate 70 is viewed in a plan view (when viewed from the Z-axis direction), the wiring A and the wiring B do not overlap with the wiring C.

According to the above configuration, it is possible to suppress the occurrence of unnecessary electromagnetic field coupling between the wiring A and the wiring B and the wiring C. As such, in the radio frequency circuit 2A, the occurrence of an unintended impedance change can be suppressed, so that a low transmission loss in the pass band and a high attenuation in the attenuation band can be secured. The impedance variable circuit 60A is arranged in the parallel arm circuit P1. Therefore, it is possible to prevent the transmission loss of the first path in which the series arm circuits S1 and S2 are arranged from deteriorating due to the influence of on-resistance of the switch SW1 caused by the impedance variable circuit 60A. Therefore, it is possible to provide the bandpass characteristic variable radio frequency circuit 2A excellent in a transmission characteristic.

Further, the input/output terminals T1 and T2 are arranged on the lower surface (second main surface) of the multilayer substrate 70, and the switch SW 1 is arranged on the upper surface (first main surface) of the multilayer substrate 70. Accordingly, the wiring A and the wiring B connected to the input/output terminal T1 or T2 are arranged on the second main surface side of the multilayer substrate 70, and the wiring C arranged in the second path in which the impedance variable circuit 60A is arranged can be arranged on the first main surface side of the multilayer substrate 70. Therefore, even when the wiring A and the wiring B and the wiring C are arranged in different dielectric layers, a wiring length of each wiring can be shortened, so that transmission loss of the radio frequency circuit 2A can be reduced.

Further, since the switch SW1 which is a variable element configuring the impedance variable circuit 60A is formed on the first main surface, the switch SW1 can be configured by a surface mount type element. Therefore, the on-resistance can be reduced as compared with the switch element configured by using each of the dielectric layers of the multilayer substrate 70. In addition, in the case where the impedance variable circuit 60 is configured by a variable inductor or a variable capacitor as illustrated in FIGS. 1BB and 1BE, the Q value can be increased as compared with a variable inductor or a variable capacitor configured by using each of the dielectric layers of the multilayer substrate 70. Accordingly, it is possible to improve the bandpass characteristic of the radio frequency circuit 2A.

In addition, as illustrated in FIG. 2B, in the radio frequency circuit 2A according to the first example, each of the series arm circuits S1 and S2 and the parallel arm circuit P1 can include one or more capacitors, and that the capacitor C1 of the series arm circuit S1 and the capacitor C2 of the series arm circuit S2 do not overlap with the capacitor C3 of the parallel arm circuit P1.

Accordingly, it is possible to suppress generation of unnecessary parasitic capacitance between the series arm circuits S1 and S2 and the parallel arm circuit P1. Thus, in the radio frequency circuit 2A, the occurrence of an unintended impedance change can be suppressed, so that lower transmission loss in the pass band and a higher attenuation in the attenuation band can be secured.

Note that although the mounting structure of the inductor L1, the capacitor C4, and a wiring connected thereto are not illustrated in FIG. 2B, it is desirable that the wiring be formed in a dielectric layer different from the dielectric layer on which the wiring A and the wiring B are formed, and the wiring do not overlap with the wiring A and the wiring B when the multilayer substrate 70 is viewed in a plan view. Thus, it is possible to suppress the occurrence of unnecessary electromagnetic field coupling between the wiring connected to the series arm circuit and the wiring connected to the parallel arm circuit. Therefore, lower transmission loss in the pass band and a higher attenuation in the attenuation band can be secured.

In the following description, as in the radio frequency circuit 2A according to the first example, the wiring A and the wiring B and the wiring C are arranged as described above, whereby descriptions will be given by comparing the bandpass characteristic in the case where unnecessary coupling between the wirings is eliminated and the bandpass characteristic in the case where unnecessary coupling is generated between the wirings without necessarily taking into consideration of arrangement relationship between the wirings.

Figure 3A:
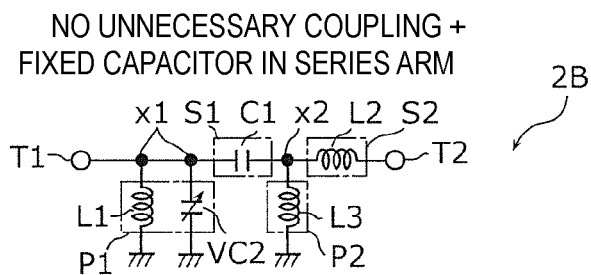
FIG. 3A is a circuit configuration diagram of a radio frequency circuit having a variable capacitance element only in a parallel arm circuit and having no unnecessary coupling.
Figure 3B:
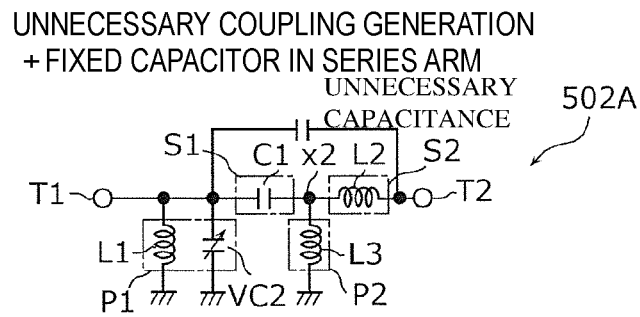
FIG. 3B is a circuit configuration diagram of a radio frequency circuit having a variable capacitance element only in a parallel arm circuit and having unnecessary coupling.

FIG. 3A is a circuit configuration diagram of a radio frequency circuit 2B having a variable element (variable capacitor) only in the parallel arm circuit P1 and having no unnecessary coupling. In addition, FIG. 3B is a circuit configuration diagram of a radio frequency circuit 502A having a variable capacitance element only in the parallel arm circuit P1 and having a wiring arrangement configuration in which unnecessary coupling is generated. In addition, FIG. 3C is a circuit configuration diagram of a radio frequency circuit 502B having a variable capacitance element (variable capacitor) in the parallel arm circuit P1 and the series arm circuit S1, and having a wiring arrangement configuration in which unnecessary coupling is generated.

The radio frequency circuit 2B illustrated in FIG. 3A is included in the present disclosure and includes the input/output terminals T1 and T2 and the series arm circuits S1 and S2, and the parallel arm circuits P1 and P2. Each of the series arm circuits S1 and S2 are a first series arm circuit and a second series arm circuit which are arranged in series in the first path connecting the input/output terminals T1 and T2. The series arm circuit S1 includes the capacitor C1 which is arranged in series in the first path. The series arm circuit S2 includes the inductor L2 which is arranged in series in the first path. The parallel arm circuit P1 is arranged in the second path connecting the node x1 on the first path and the ground, and is configured by a parallel connection circuit of the inductor L1 and a variable capacitor VC2. The variable capacitor VC2 configures a first impedance variable circuit. The parallel arm circuit P2 is arranged in a path connecting a node x2 on the first path and the ground, and is configured by an inductor L3. In the circuit configuration described above, the radio frequency circuit 2B has a mounting structure in which a wiring connected to the series arm circuit and the input/output terminal T1 or T2 and the third wiring configuring a partial region of the second path are not electromagnetically coupled to each other.

The radio frequency circuit 502A illustrated in FIG. 3B is a comparative example, and the circuit connection configuration thereof is the same as the circuit connection configuration of the radio frequency circuit 2B illustrated in FIG. 3A. However, the radio frequency circuit 502A has a mounting structure in which a wiring connected to the series arm circuit and the input/output terminal T1 or T2 and a wiring configuring a partial region of the second path are electromagnetically coupled to each other.

Figure 3C:
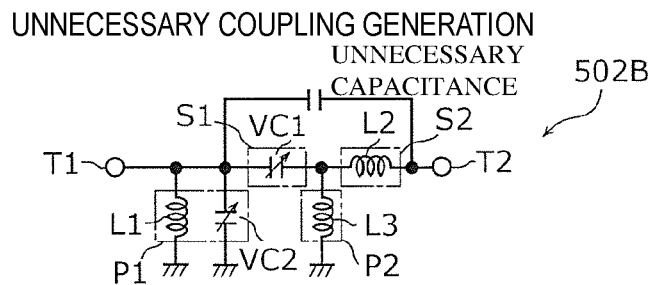
FIG. 3C is a circuit configuration diagram of a radio frequency circuit having a variable capacitance element in a parallel arm circuit and a series arm circuit and having unnecessary coupling.

The radio frequency circuit 502B illustrated in FIG. 3C is a comparative example, and the circuit connection configuration thereof differs only in that the capacitor C1 is replaced by a variable capacitor VC1 as compared with the circuit connection configuration of the radio frequency circuit 502A illustrated in FIG. 3B. In addition, the radio frequency circuit 502B has a mounting structure in which a wiring connected to the series arm circuit and the input/output terminal T1 or T2 and a wiring configuring a partial region of the second path are electromagnetically coupled to each other.

Figure 4A:
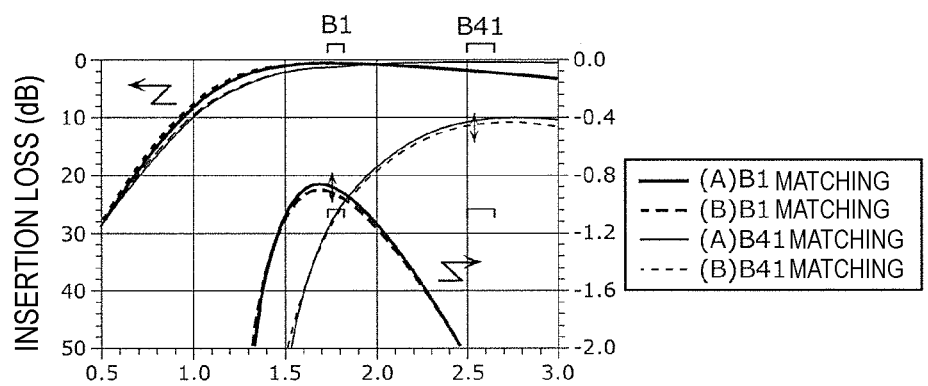
FIGS. 4A and 4B are graphs comparing bandpass characteristics of the radio frequency circuits depending on the presence or absence of unnecessary coupling.
Figure 4B:
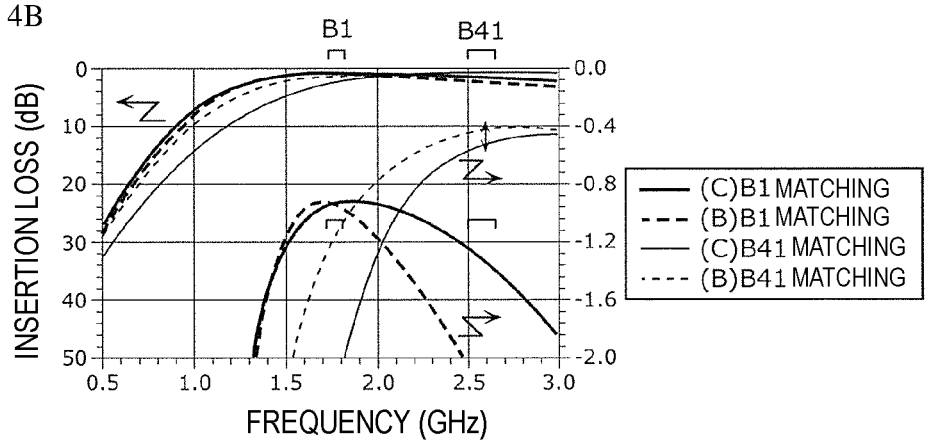

FIGS. 4A and 4B are graphs comparing the bandpass characteristic of the radio frequency circuit according to the presence or absence of unnecessary coupling. In (a) of this figure, the case where the pass band is adjusted to a Band 1 of LTE (Long Term Evolution) by varying the variable capacitor VC2 of the radio frequency circuit 2B ((A)B1 matching in the figure) and the case where the pass band is adjusted to a Band 41 of LTE ((A)B41 matching in the figure) are illustrated. Additionally, in (a) of this figure, the case where the pass band is adjusted to the Band 1 of LTE by varying the variable capacitor VC2 of the radio frequency circuit 502A ((B)B1 matching in the figure) and the case where the pass band is adjusted to the Band 41 of LTE ((B)B41 matching in the figure) are illustrated. Additionally, in (b) of this figure, the case where the pass band is adjusted to the Band 1 of LTE by varying the variable capacitors VC1 and VC2 of the radio frequency circuit 502B ((C)B1 matching in the figure) and the case where the pass band is adjusted to the Band 41 of LTE ((C)B41 matching in the figure) are illustrated. Additionally, in (b) of this figure, the case where the pass band is adjusted to the Band 1 of LTE by varying the variable capacitor VC2 of the radio frequency circuit 502A ((B)B1 matching in the figure) and the case where the pass band is adjusted to the Band 41 of LTE ((B)B41 matching in the figure) are illustrated.

As illustrated in FIG. 4A, in comparison between the radio frequency circuit 2B and the radio frequency circuit 502A, it can be seen that insertion loss in the pass band is reduced in both of the Band 1 and the Band 41 in the radio frequency circuit 2B in which unnecessary coupling is eliminated.

Moreover, as illustrated in FIG. 4B, in comparison between the radio frequency circuit 502A and the radio frequency circuit 502B, the insertion loss in the pass band in the Band 41 is increased in the radio frequency circuit 502B. This is because in the radio frequency circuit 502B, the series arm circuit S1 has the variable capacitor VC1 having a low Q value instead of a fixed capacitor.

[1.2 Configuration of Radio Frequency Circuit According to Modification]

Here, although the circuit connection structure of the radio frequency circuit 2A according to the first example is provided, the wiring A and the wiring B show configurations of the radio frequency circuits 502C to 502G each of which is not formed in a dielectric layer different from that of a dielectric layer on which the wiring C is formed. This configuration also makes it possible to suppress the occurrence of unnecessary electromagnetic field coupling between the wiring A and the wiring B and the wiring C.

Figure 5A:
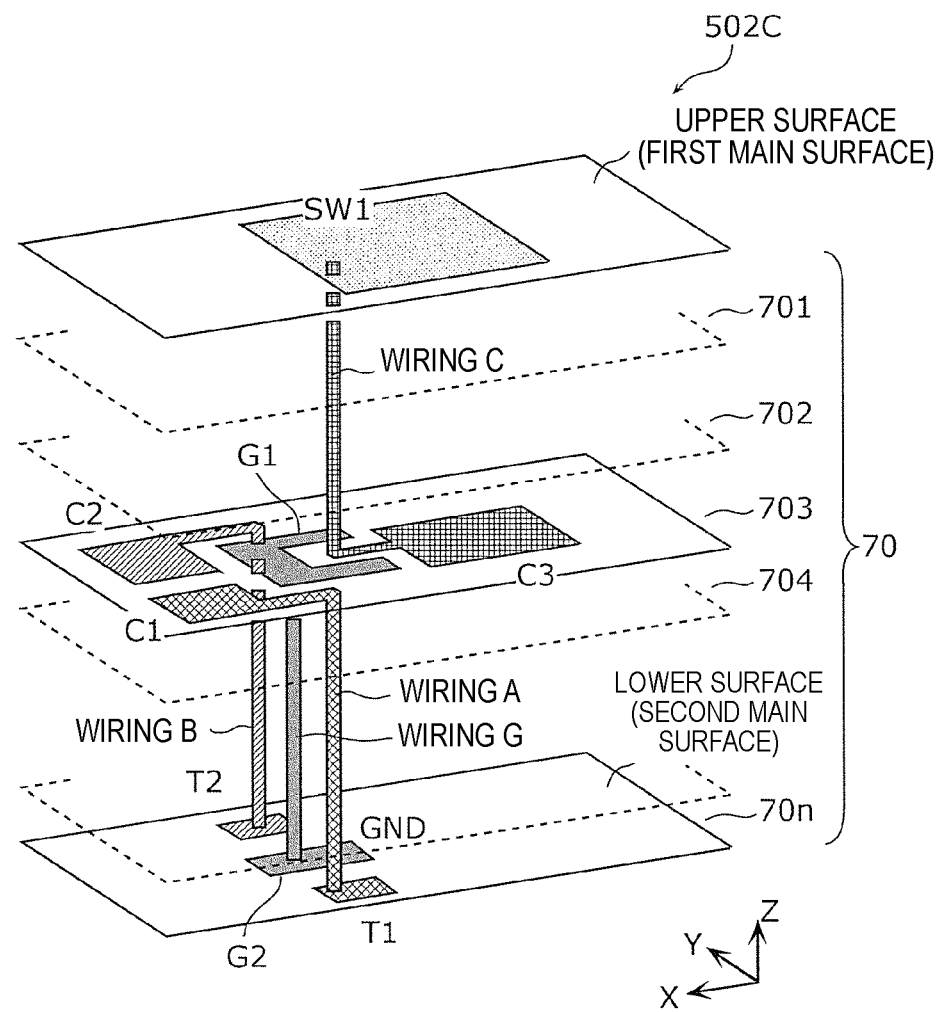
FIG. 5A is a perspective view illustrating a mounting structure of a radio frequency circuit according to a first modification.

FIG. 5A is a perspective view illustrating a mounting structure of the radio frequency circuit 502C according to the first modification. In this figure, the arrangement relationship of circuit elements and wirings which are formed in the multilayer substrate 70 and configure the radio frequency circuit 502C is illustrated.

The switch SW1 is formed in the dielectric layer 701 and is formed on the upper surface (first main surface) of the multilayer substrate 70. In addition, the capacitor C3 is formed in the dielectric layer 704. Thus, the wiring C is formed in the dielectric layers 701 to 704. Note that the capacitor C3 is not limited to being formed in the dielectric layer 704, and may be formed in a layer lower than the dielectric layer 701 and upper than the dielectric layer 70n.

The input/output terminals T1 and T2 are formed in the dielectric layer 70n, and are formed on a lower surface (a second main surface) of the multilayer substrate 70. In addition, the capacitors C1 and C2 are formed in the dielectric layer 704. Thus, the wiring A and the wiring B are formed in the dielectric layers 704 to 70n. Note that the capacitors C1 and C2 are not limited to being formed in the dielectric layer 704, and may be formed in the same layer as the layer in which the capacitor C3 is formed.

That is, the wiring A and the wiring B and the wiring C are formed in the common dielectric layer 704. Note that in the case where the multilayer substrate 70 is viewed in a plan view (when viewed from the Z-axis direction), the wiring A and the wiring B do not overlap with the wiring C.

In addition, in the dielectric layer 704, a ground pattern G1 is formed between the capacitors C1 and C2 and the capacitor C3. In addition, a ground pattern G2 is formed between the input/output terminals T1 and T2 in the dielectric layer 70n. The ground patterns G1 and G2 are connected to each other by a wiring G formed in the dielectric layers 704 to 70n.

According to the above configuration, the wiring A and the wiring B and the wiring C are formed in the same dielectric layer 704, but the ground pattern G1 is formed between the wiring A and the wiring B and the wiring C. Therefore, it is possible to suppress the occurrence of unnecessary electromagnetic field coupling between the wiring A and the wiring B and the wiring C. Thus, in the radio frequency circuit 502C, the occurrence of an unintended impedance change can be suppressed, so that deterioration in the bandpass characteristic and an attenuation characteristic can be suppressed.

Figure 5B:
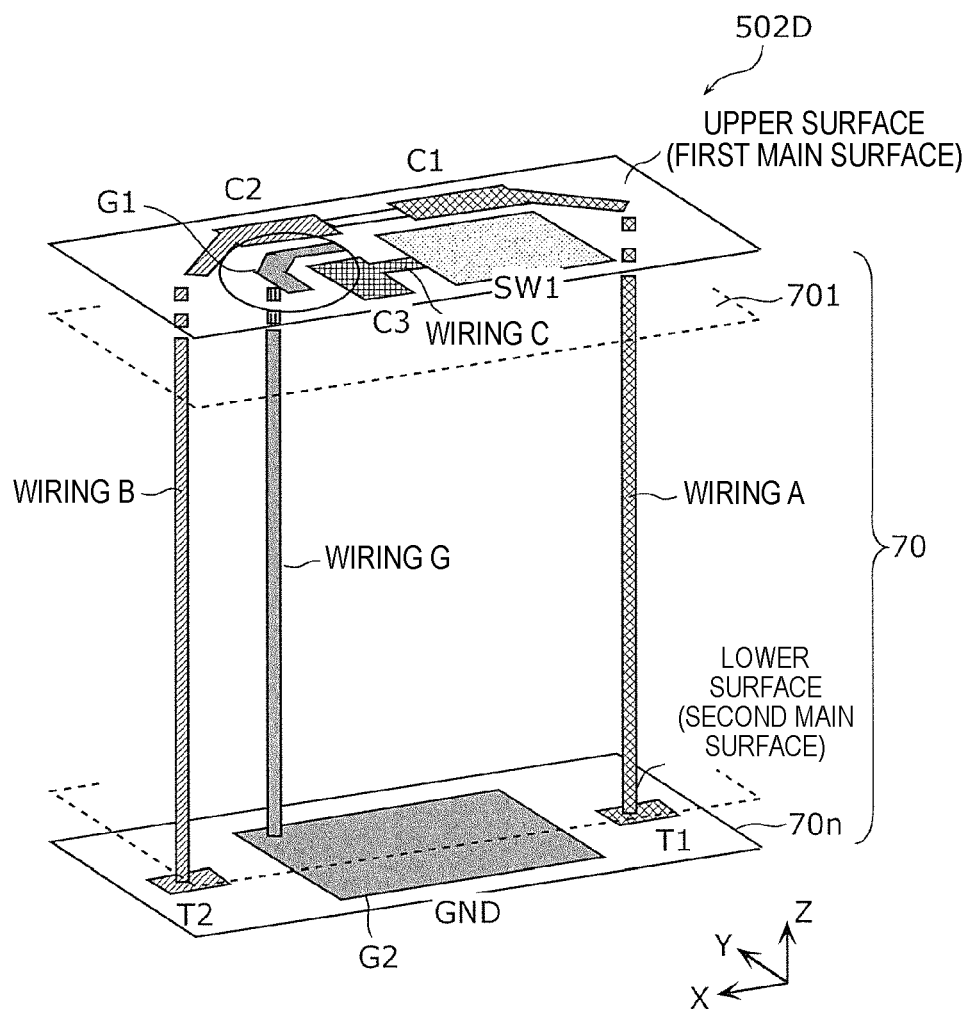
FIG. 5B is a perspective view illustrating a mounting structure of a radio frequency circuit according to a second modification.

FIG. 5B is a perspective view illustrating a mounting structure of the radio frequency circuit 502D according to a second modification. In this figure, the arrangement relationship of each of the circuit elements and wirings which are formed in the multilayer substrate 70 and configure the radio frequency circuit 502D is illustrated.

The switch SW1 is formed in the dielectric layer 701 and is formed on the upper surface (first main surface) of the multilayer substrate 70. The capacitor C3 is formed in the dielectric layer 701. Thus, the wiring C is formed in the dielectric layer 701.

Note that the switch SW1 and the capacitor C3 of this modification may be formed into one package by an integrated passive device (IPD).

The input/output terminals T1 and T2 are formed in the dielectric layer 70n, and are formed on a lower surface (a second main surface) of the multilayer substrate 70. In addition, the capacitors C1 and C2 are formed in the dielectric layer 701. Thus, the wiring A and the wiring B are formed in the dielectric layers 701 to 70n.

That is, the wiring A and the wiring B and the wiring C are formed in the common dielectric layer 701. Note that in a case where the multilayer substrate 70 is viewed in a plan view (when viewed from the Z-axis direction), the wiring A and the wiring B do not overlap with the wiring C.

In addition, in the dielectric layer 701, a ground pattern G1 is formed between the capacitors C1 and C2 and the capacitor C3. In addition, a ground pattern G2 is formed between the input/output terminals T1 and T2 in the dielectric layer 70n. The ground patterns G1 and G2 are connected to each other by a wiring G formed in the dielectric layers 701 to 70n.

According to the above configuration, the wiring A and the wiring B and the wiring C are formed in the same dielectric layer 701, but the ground pattern G1 is formed between the wiring A and the wiring B and the wiring C. Therefore, it is possible to suppress the occurrence of unnecessary electromagnetic field coupling between the wiring A and the wiring B and the wiring C. As a result, in the radio frequency circuit 502D, the occurrence of an unintended impedance change can be suppressed, so that deterioration in the bandpass characteristic and the attenuation characteristic can be suppressed.

Figure 5C:
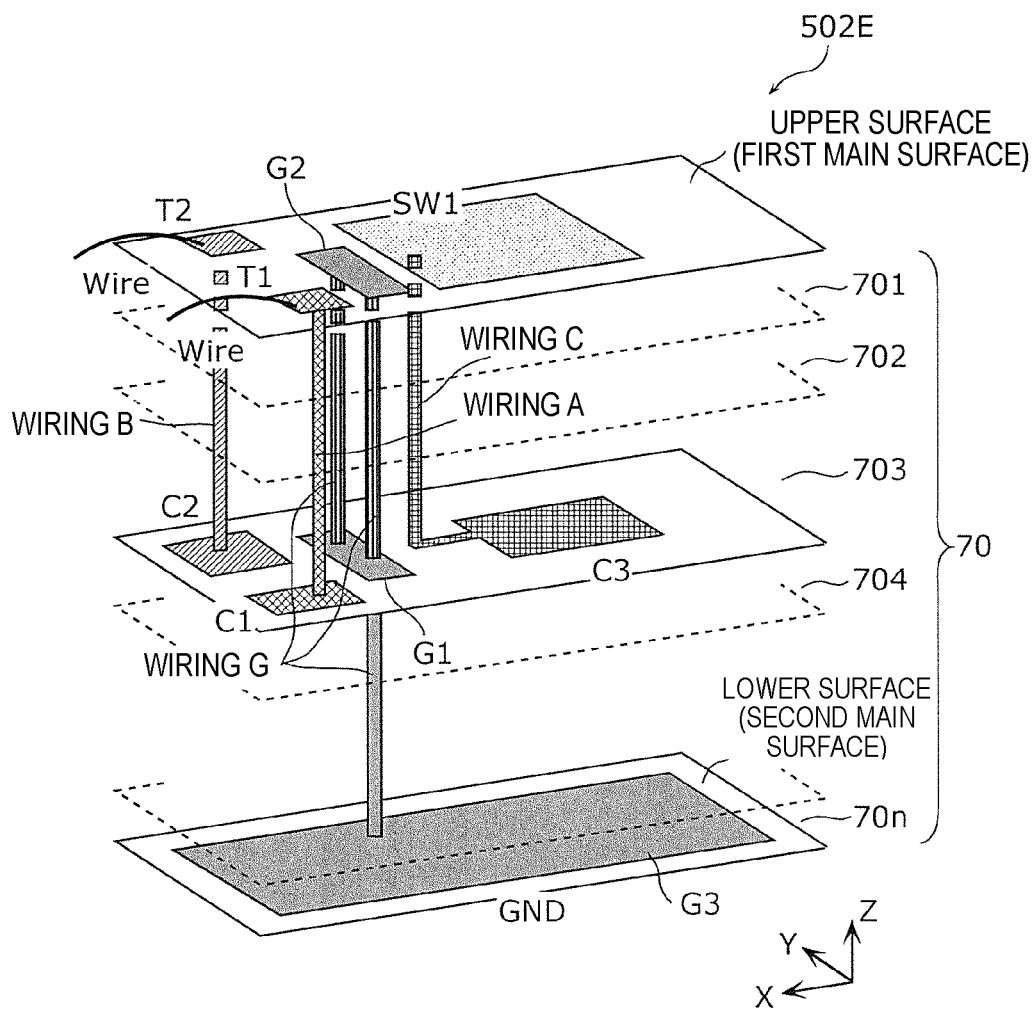
FIG. 5C is a perspective view illustrating a mounting structure of a radio frequency circuit according to a third modification.

FIG. 5C is a perspective view illustrating a mounting structure of the radio frequency circuit 502E according to a third modification. In this figure, the arrangement relationship of each of the circuit elements and wirings which are formed in the multilayer substrate 70 and configure the radio frequency circuit 502E is illustrated.

The switch SW1 is formed in the dielectric layer 701 and is formed on an upper surface (a first main surface) of the multilayer substrate 70. The capacitor C3 is formed in the dielectric layer 704. Thus, the wiring C is formed in the dielectric layers 701 to 704. Note that the capacitor C3 is not limited to being formed in the dielectric layer 704, and may be formed in a layer lower than the dielectric layer 701 and upper than the dielectric layer 70n.

The input/output terminals T1 and T2 are formed in the dielectric layer 701, and are formed on the upper surface (first main surface) of the multilayer substrate 70. In addition, the capacitors C1 and C2 are formed in the dielectric layer 704. Thus, the wiring A and the wiring B are formed in the dielectric layers 701 to 704. Note that the capacitors C1 and C2 are not limited to being formed in the dielectric layer 704, and may be formed in the same layer as the layer in which the capacitor C3 is formed.

That is, the wiring A and the wiring B and the wiring C are formed in the common dielectric layers 701 to 704. Note that in the case where the multilayer substrate 70 is viewed in a plan view (when viewed from the Z-axis direction), the wiring A and the wiring B do not overlap with the wiring C. Further, the input/output terminals T1 and T2 are formed on the upper surface (first main surface) of the multilayer substrate 70, and the input/output signal is led out to the lower surface side of the multilayer substrate 70 by a bonding wire.

In addition, in the dielectric layer 701, the ground pattern G2 is formed between the input/output terminals T1 and T2 and the switch SW1. In the dielectric layer 704, the ground pattern G1 is formed between the capacitors C1 and C2 and the capacitor C3. In addition, in the dielectric layer 70n, a ground pattern G3 is formed. The ground patterns G1, G2, and G3 are connected to each other by the wiring G formed in the dielectric layers 701 to 70n.

According to the above configuration, although the wiring A and the wiring B and the wiring C are formed in the same dielectric layers 701 to 704, the ground pattern G1 is formed between the capacitors C1 and C2 and the capacitor C3, and the wiring G is formed between the wiring A and the wiring B and the wiring C. Therefore, it is possible to suppress the occurrence of unnecessary electromagnetic field coupling between the wiring A and the wiring B and the wiring C. As a result, in the radio frequency circuit 502E, the occurrence of an unintended impedance change can be suppressed, so that deterioration in the bandpass characteristic and the attenuation characteristic can be suppressed.

Figure 5D:
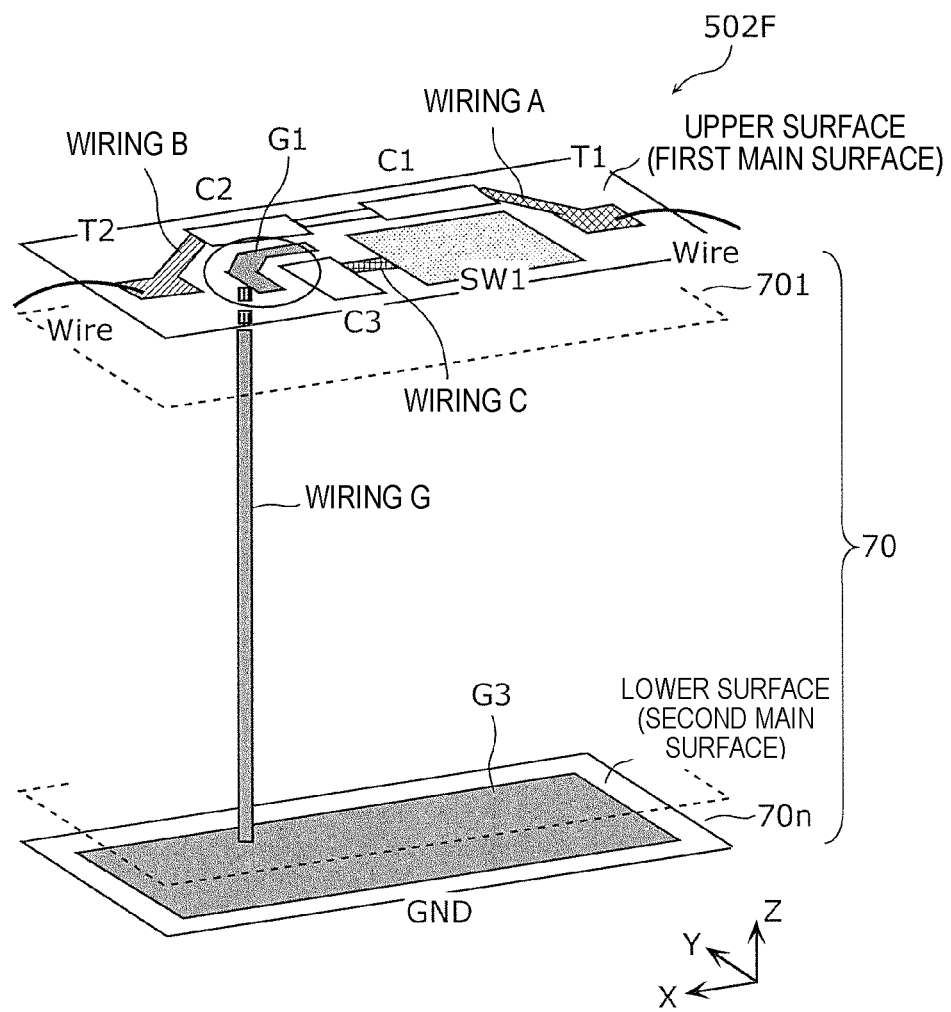
FIG. 5D is a perspective view illustrating a mounting structure of a radio frequency circuit according to a fourth modification.

FIG. 5D is a perspective view illustrating a mounting structure of the radio frequency circuit 502F according to a fourth modification. In this figure, the arrangement relationship of each of the circuit elements and wirings which are formed in the multilayer substrate 70 and configure the radio frequency circuit 502F is illustrated.

The switch SW1 is formed in the dielectric layer 701 and is formed on the upper surface (first main surface) of the multilayer substrate 70. The capacitor C3 is formed in the dielectric layer 701. Thus, the wiring C is formed in the dielectric layer 701.

The input/output terminals T1 and T2 are formed in the dielectric layer 701, and are formed on the upper surface (first main surface) of the multilayer substrate 70. The capacitors C1 and C2 are formed in the dielectric layer 701. Thus, the wiring A and the wiring B are formed in the dielectric layer 701.

That is, the wiring A and the wiring B and the wiring C are formed in the common dielectric layer 701. Note that in a case where the multilayer substrate 70 is viewed in a plan view (when viewed from the Z-axis direction), the wiring A and the wiring B do not overlap with the wiring C. Further, the input/output terminals T1 and T2 are formed on the upper surface (first main surface) of the multilayer substrate 70, and the input/output signal is led out to the lower surface side of the multilayer substrate 70 by a bonding wire.

In addition, in the dielectric layer 701, the ground pattern G1 is formed between the capacitors C1 and C2 and the capacitor C3. In addition, in the dielectric layer 70n, the ground pattern G3 is formed. The ground patterns G1 and G3 are connected to each other by the wiring G formed in the dielectric layers 701 to 70n.

According to the above configuration, the wiring A and the wiring B and the wiring C are formed in the same dielectric layer 701, but the ground pattern G1 is formed between the capacitors C1 and C2 and the capacitor C3. Therefore, it is possible to suppress the occurrence of unnecessary electromagnetic field coupling between the wiring A and the wiring B and the wiring C. As a result, in the radio frequency circuit 502F, the occurrence of an unintended impedance change can be suppressed, so that deterioration in the bandpass characteristic and the attenuation characteristic can be suppressed.

Figure 5E:
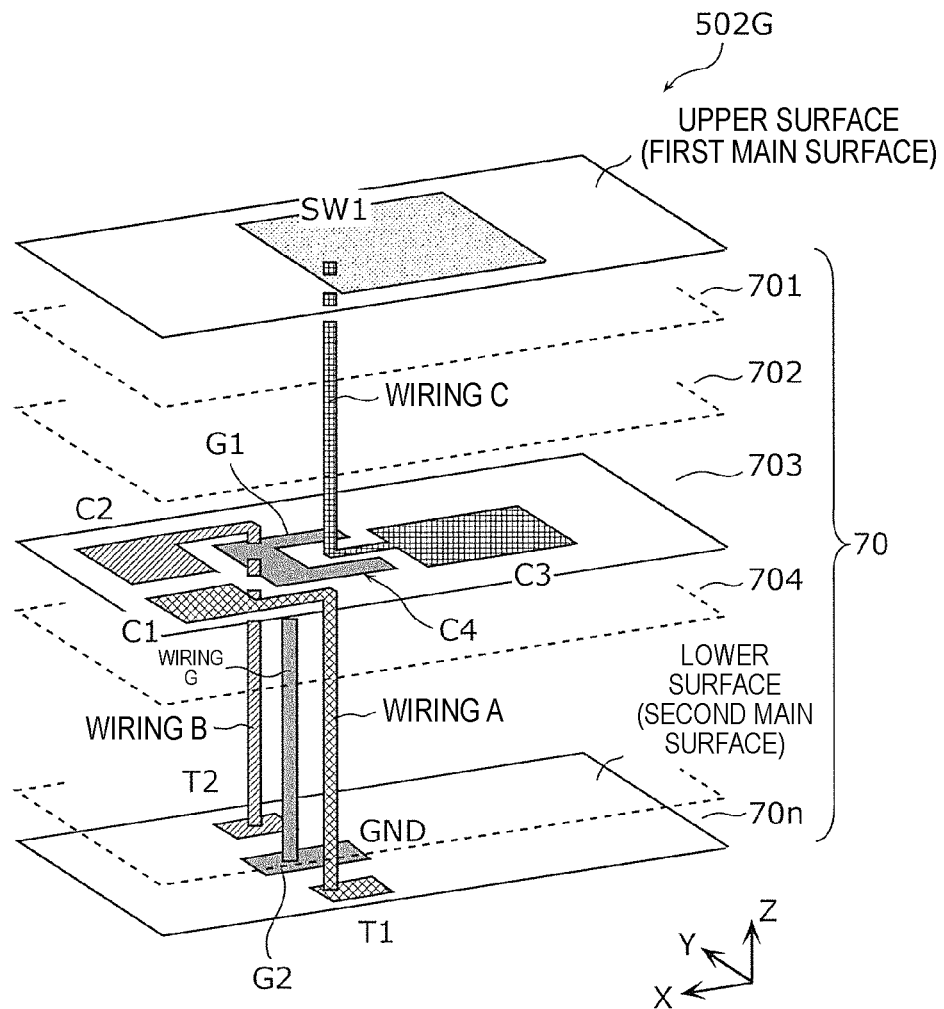
FIG. 5E is a perspective view illustrating a mounting structure of a radio frequency circuit according to a fifth modification.

FIG. 5E is a perspective view illustrating a mounting structure of the radio frequency circuit 502G according to a fifth modification. In this figure, the arrangement relationship of circuit elements and wirings which are formed in the multilayer substrate 70 and configure the radio frequency circuit 502G is illustrated.

The switch SW1 is formed in the dielectric layer 701 and is formed on the upper surface (first main surface) of the multilayer substrate 70. In addition, the capacitor C3 is formed in the dielectric layer 704. Thus, the wiring C is formed in the dielectric layers 701 to 704. Note that the capacitor C3 is not limited to being formed in the dielectric layer 704, and may be formed in a layer lower than the dielectric layer 701 and upper than the dielectric layer 70n.

The input/output terminals T1 and T2 are formed in the dielectric layer 70n, and are formed on a lower surface (a second main surface) of the multilayer substrate 70. In addition, the capacitors C1 and C2 are formed in the dielectric layer 704. Thus, the wiring A and the wiring B are formed in the dielectric layers 704 to 70n. Note that the capacitors C1 and C2 are not limited to being formed in the dielectric layer 704, and may be formed in the same layer as the layer in which the capacitor C3 is formed.

That is, the wiring A and the wiring B and the wiring C are formed in the common dielectric layer 704. Note that in a case where the multilayer substrate 70 is viewed in a plan view (when viewed from the Z-axis direction), the wiring A and the wiring B do not overlap with the wiring C.

In addition, the capacitor C4 connected to the ground is formed between the capacitors C1 and C2 and the capacitor C3 in the dielectric layer 704. In addition, the ground pattern G2 is formed between the input/output terminals T1 and T2 in the dielectric layer 70n. The capacitor C4 and the ground pattern G2 are connected to each other by the wiring G formed in the dielectric layers 704 to 70n.

According to the above configuration, the wiring A and the wiring B and the wiring C are formed in the same dielectric layer 704, but the electrode pattern of the capacitor C4 connected to the ground is formed between the wiring A and the wiring B and the wiring C. Therefore, it is possible to suppress the occurrence of unnecessary electromagnetic field coupling between the wiring A and the wiring B and the wiring C. As a result, in the radio frequency circuit 502G, the occurrence of an unintended impedance change can be suppressed, so that deterioration in the bandpass characteristic and the attenuation characteristic can be suppressed.

Second Embodiment

In this embodiment, a multiplexer 10, a radio frequency front end circuit 50, and a communication apparatus 1 using the radio frequency circuit 2 according to the first embodiment will be described.

[2.1 Configuration of Communication Apparatus]

Figure 6A:
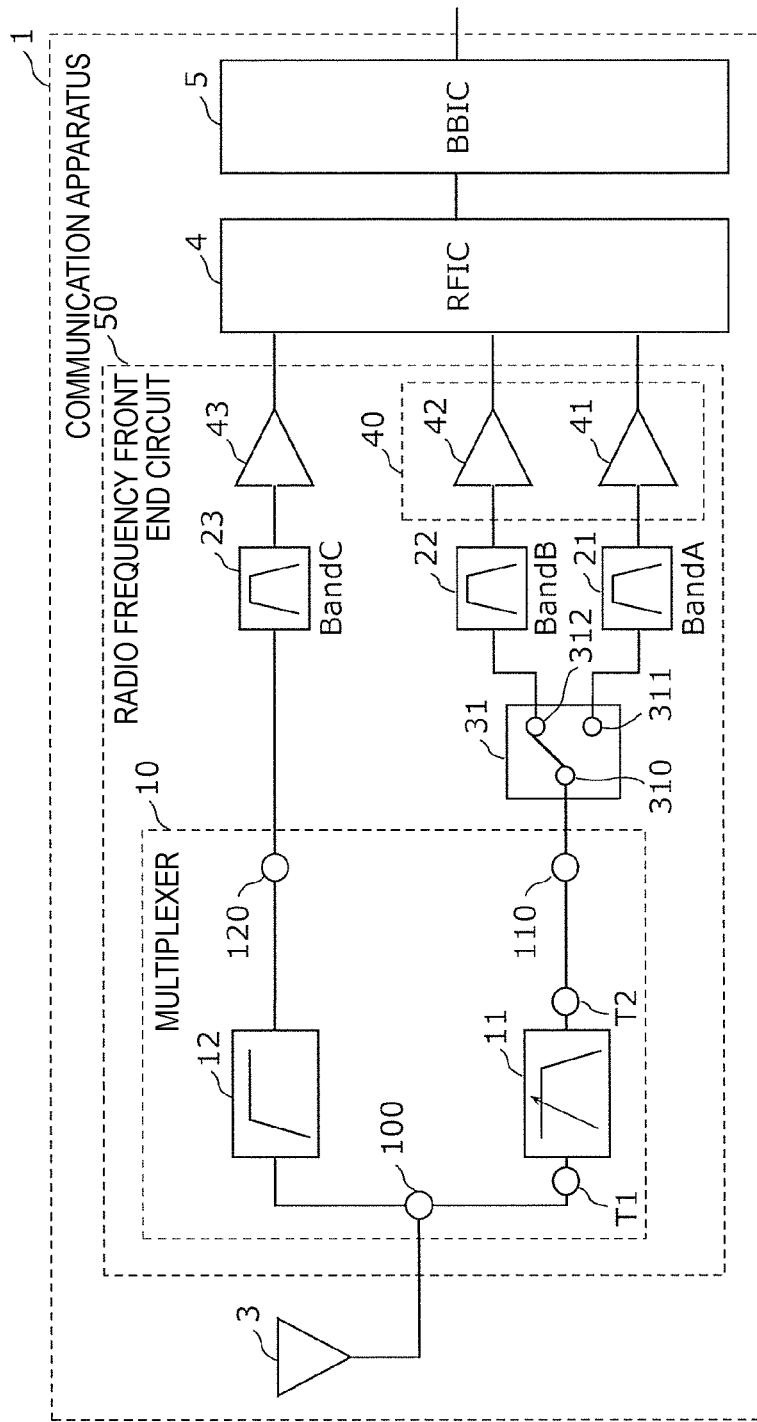
FIG. 6A is a circuit configuration diagram of a communication apparatus according to a second embodiment.

FIG. 6A is a circuit configuration diagram of the communication apparatus 1 according to the second embodiment. As illustrated in FIG. 6A, the communication apparatus 1 includes an antenna element 3, the radio frequency front end circuit 50, an RF signal processing circuit (RFIC) 4, and a baseband signal processing circuit (BBIC) 5.

The RFIC 4 is an RF signal processing circuit for processing a radio frequency signal transmitted and received by the antenna element 3. Specifically, the RFIC 4 performs signal processing of a radio frequency signal (here, a radio frequency reception signal) input from the antenna element 3 with the radio frequency front end circuit 50 interposed therebetween by down-conversion or the like, and outputs the reception signal generated by the signal processing to the BBIC 5. Additionally, the RFIC 4 is also capable of performing signal processing on a transmission signal input from the BBIC 5 by up-conversion or the like, and outputting the radio frequency signal (here, a radio frequency transmission signal) generated by the signal processing to a transmission-side signal path.

In this embodiment, the RFIC 4 also has a function as a control unit for controlling the connection of a switch (described later) included in the radio frequency front end circuit 50 based on the frequency band (band) to be used. Specifically, the RFIC 4 switches the connection of the switch included in the radio frequency front end circuit 50 by a control signal (not illustrated). The control unit may be provided outside the RFIC 4, or may be provided in the radio frequency front end circuit 50 or the BBIC 5, for example.

Next, a detailed configuration of the radio frequency front end circuit 50 will be described.

As illustrated in FIG. 6A, the radio frequency front end circuit 50 is a reception system front end circuit, and includes the multiplexer 10, a switch 31, filters 21, 22, and 23, and reception amplifiers 41, 42, and 43.

The multiplexer 10 includes a common terminal 100, input/output terminals 110 and 120, a low pass filter 11, and a high pass filter 12.

The low pass filter 11 is a low pass type filter in which the radio frequency circuit 2 according to the first embodiment is applied, the input/output terminals T1 and T2, the series arm circuits S1 and S2, and the parallel arm circuit P1 are included, a frequency range of a low band group is set as a pass band, and a frequency range of a high band group is set as a attenuation band. The input/output terminal T1 is connected to the common terminal 100, and the input/output terminal T2 is connected to the input/output terminal 110. The low pass filter 11 includes a first impedance variable circuit having a first switch element, and at least one of the pass band and the attenuation band of the low pass filter 11 is varied while maintaining low loss and high attenuation by conduction and non-conduction of the first switch element.

The high pass filter 12 is a high pass type filter which is arranged between the common terminal 100 and the input/output terminal 120, takes a frequency range of the high band group as the pass band, and takes a frequency range of the low band group as the attenuation band.

Note that, in this embodiment, a filter which is variable in frequency by including the first switch element is defined as a first filter, and a filter which is fixed in frequency is defined as a second filter. Further, an input/output terminal to which the first filter is connected is defined as a third input/output terminal, and an input/output terminal to which the second filter is connected is defined as a fourth input/output terminal. In addition, the pass band of the first filter is switched between a first frequency band and a second frequency band by conduction and non-conduction of the first switch element. Additionally, the pass band of the second filter is a third frequency band. The first frequency band and the second frequency band belong to a first frequency band group, and the third frequency band belongs to a second frequency band group.

Thus, in the multiplexer 10 illustrated in FIG. 6A, the low pass filter 11 is the first filter, the high pass filter 12 is the second filter, the input/output terminal 110 is the third input/output terminal, and the input/output terminal 120 is the fourth input/output terminal. Further, the low band group is the first frequency band group, and the high band group is the second frequency band group.

The switch 31 is a third switch element which includes a common terminal 310 (second common terminal), and a selection terminal 311 (first selection terminal) and a selection terminal 312 (second selection terminal), the common terminal 310 being connected to the input/output terminal 110. The switch 31 is a single pole double throw (SPDT) type switch circuit in which the common terminal 310 can be connected to either of the selection terminal 311 or 312. Note that the switch 31 may have a circuit configuration in which two single pole single throw (SPST) type switches are arranged in parallel. In addition, a switch circuit such as SP3T and SP4T may be used, and in this case, a common terminal and a necessary selection terminal may be used.

The filter 21 is a band pass filter which is connected to the selection terminal 311 and whose pass band is a Band A. The filter 22 is a band pass filter which is connected to the selection terminal 312 and whose pass band is a Band B. The filter 23 is a band pass filter which is connected to the input/output terminal 120 and whose pass band is a Band C.

In the radio frequency front end circuit 50 illustrated in FIG. 6A, the filter 21 is a third filter in which the first frequency band (Band A) is set as a pass band. The filter 22 is a fourth filter in which the second frequency band (Band B) is set as a pass band. The filter 23 is a fifth filter in which the third frequency band (Band C) is set as a pass band.

The reception amplifier 41 is connected to the filter 21, the reception amplifier 42 is connected to the filter 22, and the reception amplifier 43 is connected to the filter 23. Each of the reception amplifiers 41 to 43 is a low-noise amplifier configured by, for example, a transistor or the like. The reception amplifiers 41 and 42 configure an amplifier circuit 40 (first amplifier circuit). The reception amplifier 43 is a second amplifier circuit. The amplifier circuit 40 may be configured by one reception amplifier, and in this case, an SPDT type switch is arranged between the filters 21 and 22 and the amplifier circuit 40.

Figure 6B:
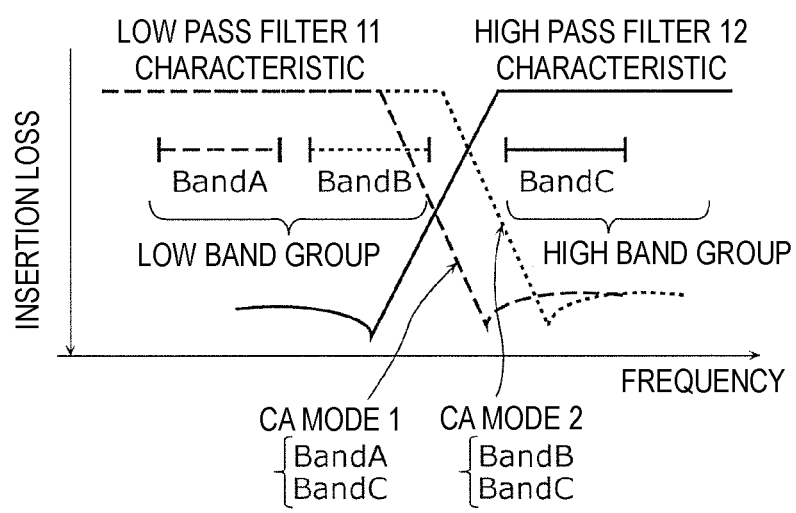
FIG. 6B is a diagram illustrating the relationship between a bandpass characteristic of a multiplexer according to the second embodiment and a CA mode.

FIG. 6B is a diagram illustrating the relationship between bandpass characteristics of the multiplexer 10 according to the second embodiment and CA modes. In this figure, frequency allocation of the Band A, the Band B, and the Band C is illustrated, and as an example, the Bands A, the Band B, and the Band C are assumed in ascending order of frequency. Also illustrated in this figure are the bandpass characteristic of the frequency variable low pass filter 11 and the bandpass characteristic of the fixed-frequency high pass filter 12.

Note that the Band A (first frequency band) and the Band B (second frequency band) may partially overlap with each other. That is, at least a part of the Band B (second frequency band) is located between the Band A (first frequency band) and the Band C (third frequency band).

For example, in the band arrangement described in FIGS. 1BA-1BF, the Band A may be set as a first frequency band and the Band E (Band A+Band B) including the Band A and the Band B may be set as a second frequency band.

The multiplexer 10 and the radio frequency front end circuit 50 are capable of simultaneously transmitting the radio frequency signal of one of the Band A and the Band B belonging to the low band group, and the radio frequency signal of the Band C belonging to the high band group. Specifically, it is possible to perform a CA mode 1 of the Band A and the Band C, and a CA mode 2 of the Band B and the Band C. Further, the radio frequency signal of the Band A and the radio frequency signal of the Band B are exclusively transmitted.

As illustrated in FIG. 6B, for example, in (1) the CA mode 1 in which the Band A and the Band C are simultaneously used, and (2) the CA mode 2 in which the Band B and the Band C are simultaneously used, frequency intervals of two frequency bands to be simultaneously used are different. In this example, the frequency interval of the CA mode 1 is larger than the frequency interval of the CA mode 2.

According to the configuration of the above-described multiplexer 10, as illustrated in FIG. 6B, since at least one of the pass band and the attenuation band of the low pass filter 11 is varied while maintaining low loss and high attenuation by one of the conduction and non-conduction of the first switch element, for example, in (1) a case of the CA mode 2 in which the frequency interval between two frequency bands to be used simultaneously is small, it is possible to suppress deterioration of the insertion loss on the pass band side of the high pass filter 12 in the pass band of the low pass filter 11 (pass band high-pass end of the low pass filter 11) by making the pass band of the low pass filter 11 close to the pass band of the high pass filter 12. In other words, it is possible to suppress deterioration of the insertion loss at a pass band high-pass end of the filter 22 which is connected to a subsequent stage of the low pass filter 11.

In the low pass filter 11, the wiring A which is connected to the input/output terminal T1 and which configures one end portion region of the first path, the wiring B which is connected to the input/output terminal T2 and configures another end portion region of the first path, and the wiring C which configures a partial region of the second path are formed in the multilayer substrate in which a plurality of dielectric layers are stacked. The wiring A and the wiring B are formed in a dielectric layer different from a dielectric layer in which the wiring C is formed, and when the multilayer substrate is viewed in a plan view, the wiring A and the wiring B do not overlap with the wiring C. According to this configuration, it is possible to suppress the occurrence of unnecessary electromagnetic field coupling between the wiring A and the wiring B and the wiring C, so that low transmission loss in the pass band and a high attenuation in the attenuation band of the low pass filter 11 can be secured. Accordingly, it is possible to provide the bandpass characteristic variable multiplexer 10 excellent in a transmission characteristic.

Further, according to the configuration of the above-described multiplexer 10, as illustrated in FIG. 6B, by the other of the conduction and non-conduction of the first switch element, for example, in (2) a case of the CA mode 1 in which the frequency interval between two frequency bands to be used simultaneously is large, it is possible to improve isolation of the low pass filter 11 and the high pass filter 12 by making the attenuation band of the low pass filter 11 located between the pass band of the low pass filter 11 and the pass band of the high pass filter 12 close to the pass band side (low frequency side) of the low pass filter 11.

Therefore, in the multiplexer 10 for performing the CA between the so-called low band group and the high band group, even when the frequency band to be selected is changed, deterioration of insertion loss or a demultiplexing characteristic can be suppressed.

Note that in this embodiment, a filter in which the frequency is variable by the first switch element and the radio frequency circuit 2 according to the first embodiment is applied may be the high pass filter 12 instead of the low pass filter 11.

Further, in this embodiment, the radio frequency front end circuit 50 of the receiving system is exemplified, but may be a radio frequency front end circuit of the transmission system or may be a radio frequency front end circuit which performs both transmission and reception.

[2.2 Multiplexer According to Second Example]

Figure 7A:
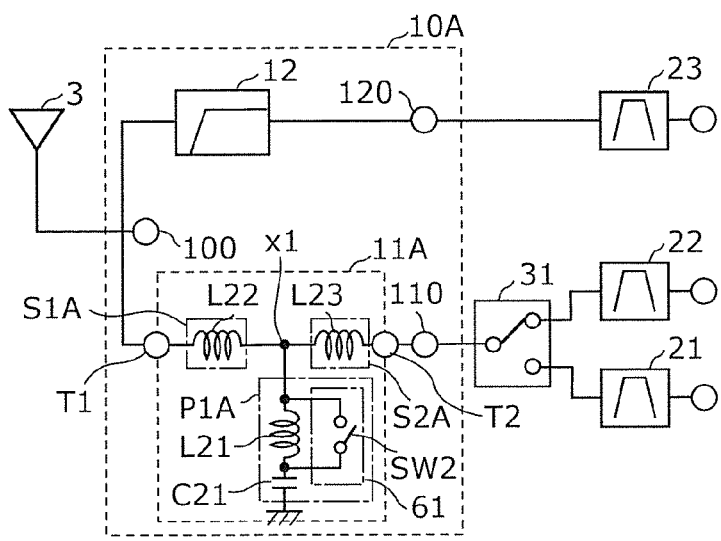
FIG. 7A is a circuit configuration diagram of a multiplexer and its peripheral circuit according to a second example.

FIG. 7A is a circuit configuration diagram of a multiplexer 10A and its peripheral circuit according to a second example. In this figure, the multiplexer 10A according to the second example, the antenna element 3, the switch 31, and the filters 21 to 23 are illustrated.

The multiplexer 10A according to the second example is a specific circuit configuration example of the multiplexer 10 according to the second embodiment, and includes a low pass filter 11A and the high pass filter 12. The multiplexer 10A according to the second example differs from the multiplexer 10 according to the second embodiment only in the circuit configuration of the low pass filter 11A. Hereinafter, for the multiplexer 10A according to the second example, the same configuration as that of the multiplexer 10 according to the second embodiment will not be described, and a different configuration will be mainly described.

The low pass filter 11A includes the input/output terminals T1 and T2, series arm circuits S1A and S2A, and a parallel arm circuit P1A.

The series arm circuit S1A includes an inductor L22 arranged in series in a first path connecting the input/output terminal T1 and the input/output terminal T2. The series arm circuit S2A has an inductor L23 which is arranged in series in the first path.

The parallel arm circuit P1A includes an inductor L21, a capacitor C21, and a switch SW2. The inductor L21 and the capacitor C21 are connected in series between the node x1 and the ground, and configure an LC series resonance circuit. The switch SW2 is a first switch element connected in parallel to the inductor L21, and configures an impedance variable circuit 61. The switch SW2 is, for example, a single pole single throw (SPST) type switch circuit.

In this example, the low pass filter 11A is a first filter, the high pass filter 12 is a second filter, the input/output terminal 110 is a third input/output terminal, and the input/output terminal 120 is a fourth input/output terminal. The low band group is the first frequency band group, and the high band group is the second frequency band group.

Figure 7B:
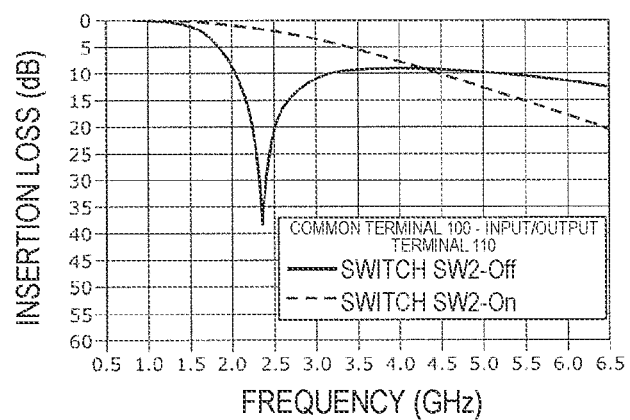
FIG. 7B is a graph illustrating a bandpass characteristic of a low pass filter of the multiplexer according to the second example.

FIG. 7B is a graph illustrating the bandpass characteristic of the low pass filter 11A of the multiplexer 10A according to the second example. As illustrated in this figure, upon the switch SW2 is conductive (ON), the inductor L21 connected in parallel to the switch SW2 is bypassed. Accordingly, the parallel arm circuit P1A does not have a resonance point, so that an attenuation pole disappears (broken line in FIG. 7B). On the other hand, upon the switch SW2 is non-conductive (OFF), the parallel arm circuit P1A becomes an LC series resonance circuit and has the resonance point, so that the attenuation pole is generated. Accordingly, steepness of the low pass filter 11A on the pass band high-pass side is improved (solid line in FIG. 7B). Therefore, the attenuation of the attenuation band of the low pass filter 11A corresponding to the pass band of the high pass filter 12 is improved. That is, isolation between the low pass filter 11A and the high pass filter 12 is improved.

In a case where the multiplexer 10A according to the second example described above is applied to, for example, the frequency allocation illustrated in FIG. 6B, it is possible to reduce the insertion loss at a high-pass end of the Band B by making the switch SW2 be conductive in the case of the CA mode 2. On the other hand, in the case of the CA mode 1, by making the switch SW2 be non-conductive, isolation between the Band A and the Band C can be improved.

Therefore, in the multiplexer 10A for performing the CA between the so-called low band group and the high band group, even when the frequency band to be selected is changed, deterioration of insertion loss or a demultiplexing characteristic can be suppressed.

Third Embodiment

In the second embodiment, one of the plurality of filters configuring the multiplexer is a frequency variable filter, whereas the multiplexer according to this embodiment has a configuration in which two of the plurality of filters configuring the multiplexer are frequency variable filters.

[3.1 Configuration of Radio Frequency Front End Circuit]

Figure 8:
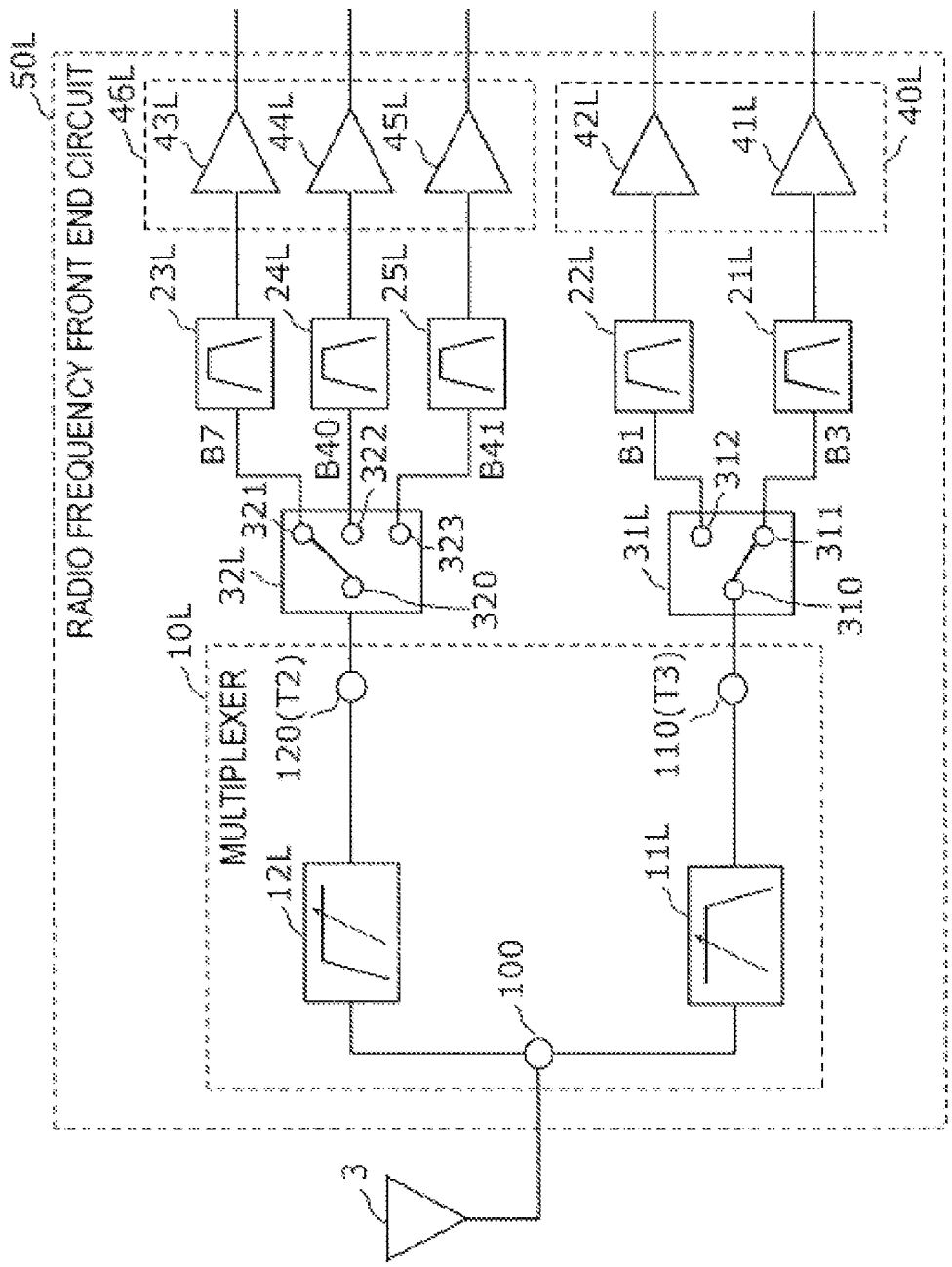
FIG. 8 is a circuit configuration diagram of a radio frequency front end circuit and its peripheral circuit according to a third embodiment.

FIG. 8 is a circuit configuration diagram of a radio frequency front end circuit 50L according to a third embodiment and its peripheral circuit. As illustrated in this figure, the radio frequency front end circuit 50L is a reception system front end circuit, and includes a multiplexer 10L, switches 31L and 32L, filters 21L, 22L, 23L, 24L, and 25L, and reception amplifiers 41L, 42L, 43L, 44L, and 45L.

The multiplexer 10L includes the common terminal 100, the input/output terminals 110 and 120, a low pass filter 11L, and a high pass filter 12L.

The low pass filter 11L is a low pass type filter in which the radio frequency circuit 2 according to the first embodiment is applied, the input/output terminals T1 and T3, the series arm circuits S1 and S2, and the parallel arm circuit P1 are included, a frequency range of the low band group is set as the pass band, and a frequency range of the high band group is set as the attenuation band. The input/output terminal T1 is connected to the common terminal 100, and the input/output terminal T3 is connected to the input/output terminal 110. The low pass filter 11L includes a first impedance variable circuit having a first switch element, at least one of the pass band and the attenuation band of the low pass filter 11L is varied while maintaining low loss and high attenuation by conduction and non-conduction of the first switch element.

The high pass filter 12L is a high pass type filter in which the radio frequency circuit 2 according to the first embodiment is applied, the input/output terminals T1 and T2, the series arm circuits S1 and S2, and the parallel arm circuit P1 are included, and a frequency range of the high band group is set as the pass band, and a frequency range of the low band group is set as the attenuation band. The input/output terminal T1 is connected to the common terminal 100, and the input/output terminal T2 is connected to the input/output terminal 120. The high pass filter 12L includes a second impedance variable circuit having a second switch element, and at least one of the pass band and the attenuation band of the high pass filter 12L is varied while maintaining low loss and high attenuation by conduction and non-conduction of the second switch element.

In this embodiment, a filter which is variable in frequency by including the first switch element is defined as a first filter, and a filter which is variable in frequency by including the second switch element is defined as a second filter. Further, an input/output terminal to which the first filter is connected is defined as a third input/output terminal, and an input/output terminal to which the second filter is connected is defined as a fourth input/output terminal. The pass band of the first filter is switched between a first frequency band and a second frequency band by conduction and non-conduction of the first switch element. The pass band of the second filter is switched between a third frequency band and a fourth frequency band by conduction and non-conduction of the second switch element. The first frequency band and the second frequency band belong to a first frequency band group, and the third frequency band and the fourth frequency band belong to a second frequency band group.

Therefore, in the multiplexer 10L illustrated in FIG. 8, the low pass filter 11L is the first filter, the high pass filter 12L is the second filter, the input/output terminal 110 is the third input/output terminal, and the input/output terminal 120 is the fourth input/output terminal. Further, the low band group is the first frequency band group, and the high band group is the second frequency band group.

The switch 31L is a third switch element which includes the common terminal 310 (second common terminal) and the selection terminal 311 (first selection terminal) and the selection terminal 312 (second selection terminal), the common terminal 310 being connected to the input/output terminal 110. The switch 31L is an SPDT type switch circuit in which the common terminal 310 can be connected to either of the selection terminal 311 or 312.

The switch 32L is a fourth switch element which includes the common terminal 320 (second common terminal), selection terminals 321 (fourth selection terminal), and 322 and 323 (third selection terminal), the common terminal 320 being connected to the input/output terminal 120. The switch 32L is an SP3T type switch circuit in which the common terminal 320 can be connected to either of the selection terminal 321, 322, or 323.

The filter 21L is connected to the selection terminal 311, and is, for example, a band pass filter in which a Band 3 (reception band: 1805 to 1880 MHz) of LTE is set as a pass band. The filter 22L is connected to the selection terminal 312, and is, for example, a band pass filter in which the Band 1 (reception band: 2110 to 2170 MHz) of LTE is set as a pass band. The filter 23L is connected to the selection terminal 321, and is, for example, a band pass filter in which a Band 7 (reception band: 2620 to 2690 MHz) of LTE is set as a pass band. The filter 24L is connected to the selection terminal 322, and is, for example, a band pass filter in which a Band 40 (reception band: 2300 to 2400 MHz) of LTE is set as a pass band. The filter 25L is connected to the selection terminal 323, and is, for example, a band pass filter in which a Band 41 (reception band: 2496 to 2690 MHz) of LTE is set as a pass band. Note that the filter 22L may set a Band 65 (reception band: 2110 to 2200 MHz) of LTE as a pass band.

In the radio frequency front end circuit 50L illustrated in FIG. 8, the filter 21L is a third filter in which the first frequency band is set as a pass band. The filter 22L is a fourth filter in which the second frequency band is set as a pass band. The filters 24L and 25L are fifth filters in which the third frequency band is set as a pass band. The filter 23L is a sixth filter in which the fourth frequency band is set as a pass band.

The reception amplifier 41L is connected to the filter 21L, the reception amplifier 42L is connected to the filter 22L, the reception amplifier 43L is connected to the filter 23L, the reception amplifier 44L is connected to the filter 24L, and the reception amplifier 45L is connected to the filter 25L. Each of the reception amplifiers 41L to 45L is a low-noise amplifier configured by, for example, a transistor or the like. The reception amplifiers 41L and 42L configure an amplifier circuit 40L (first amplifier circuit). The reception amplifiers 43L to 45L configure an amplifier circuit 46L (second amplifier circuit). Note that the amplifier circuits 40L and 46L may be configured by one reception amplifier, and in this case, an SPDT type switch is arranged between the filters 21L and 22L and the amplifier circuit 40L, and an SP3T type switch is arranged between the filters 23L to 25L and the amplifier circuit 46L.

The five bands of LTE illustrated in this embodiment are the Band 3, the Band 1, the Band 40, the Band 41, and the Band 7 in ascending order of frequency. The Band 3 and the Band 1 belong to the low band group, and the Band 40, the Band 41, and the Band 7 belong to the high band group.

According to the multiplexer 10L of this embodiment, for example, in (1) the CA mode 2 in which the Band 1 belonging to the low band group and the Band 40 belonging to the high band group are simultaneously used, and (2) the CA mode 1 in which the Band 3 belonging to the low band group and the Band 40 belonging to the high band group are simultaneously used, frequency intervals of the two frequency bands to be simultaneously used are different from each other, and the frequency interval of the CA mode 1 is larger than the frequency interval of the CA mode 2.

On the other hand, according to the multiplexer 10L, since at least one of the pass band and the attenuation band of the low pass filter 11L is varied while maintaining low loss and high attenuation by one of conduction and non-conduction of the first switch element, for example, in (1) a case of the CA mode 2 in which the frequency interval between two frequency bands to be used simultaneously is small, it is possible to suppress deterioration of the insertion loss on the pass band side of the high pass filter 12L in the pass band of the low pass filter 11L (pass band high-pass end of the low pass filter 11L) by making the pass band of the low pass filter 11L close to the pass band of the high pass filter 12L. In other words, it is possible to suppress degradation of the insertion loss at a pass band high-pass end of the filter 22L connected to a subsequent stage of the low pass filter 11L.

Further, according to the multiplexer 10L, by the other of the conduction and non-conduction of the first switch element, for example, in (2) a case of the CA mode 1 in which the frequency interval between two frequency bands used simultaneously is large, it is possible to improve isolation of the low pass filter 11L and the high pass filter 12L by making the attenuation band of the low pass filter 11L located between the pass band of the low pass filter 11L and the pass band of the high pass filter 12L close to the pass band side (low frequency side) of the low pass filter 11L.

Additionally, according to the multiplexer 10L of this embodiment, for example, in (1) a CA mode 3 in which the Band 40 (or Band 41) belonging to the high band group and the Band 1 belonging to the low band group are simultaneously used, and (2) a CA mode 4 in which the Band 7 belonging to the high band and the Band 1 belonging to the low band group are simultaneously used, frequency intervals of two frequency bands to be simultaneously used are different from each other, and the frequency interval of the CA mode 4 is larger than the frequency interval of the CA mode 3.

According to the above-described configuration, since at least one of the pass band and the attenuation band of the high pass filter 12L is varied while maintaining low loss and high attenuation by one of the conduction and non-conduction of the second switch element, for example, in (1) a case of the CA mode 3 in which the frequency interval between two frequency bands used simultaneously is small, it is possible to suppress deterioration of the insertion loss on the pass band side of the low pass filter 11L in the pass band of the high pass filter 12L (pass band low-frequency end of the high pass filter 12L) by making the pass band of the high pass filter 12L close to the pass band of the low pass filter 11L.

In addition, according to the multiplexer 10L, by the other of the conduction and non-conduction of the second switch element, for example, in (2) a case of the CA mode 4 in which the frequency interval between two frequency bands used simultaneously is large, it is possible to improve isolation of the low pass filter 11L and the high pass filter 12L by making the attenuation band of the high pass filter 12L located between the pass band of the high pass filter 12L and the pass band of the low pass filter 11L close to the pass band of the high pass filter 12L.

Furthermore, by setting both the low pass filter 11L and the high pass filter 12L to be variable in frequency, the pass band and the attenuation band of the low pass filter 11L and the high pass filter 12L can be optimized even in the case where any combination is selected in the CA using any one of the frequency bands belonging to the low band group and any one of the frequency bands belonging to the high band group.

Therefore, in the multiplexer 10L for performing the CA between the so-called low band group and the high band group, even when the frequency band to be selected is changed, deterioration in insertion loss or a demultiplexing characteristic can be suppressed. Therefore, it is possible to provide the bandpass characteristic variable multiplexer 10L excellent in a transmission characteristic.

Hereinafter, a specific example of the circuit configuration of the multiplexer according to the third embodiment will be described with reference to a third example.

[3.2 Multiplexer According to Third Example]

Figure 9A:
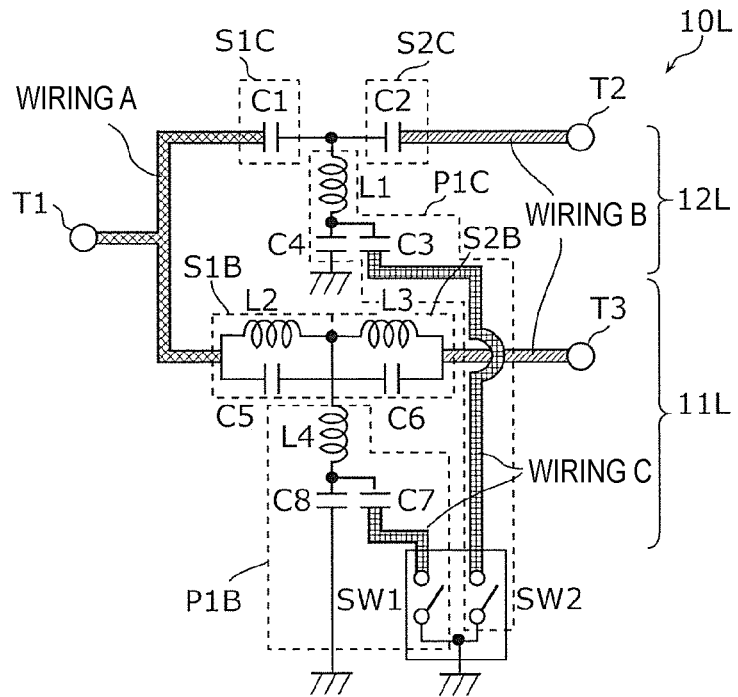
FIG. 9A is a circuit configuration diagram of a multiplexer according to a third example.

FIG. 9A is a circuit configuration diagram of the multiplexer 10L according to the third example. The multiplexer 10L according to the third example is a specific circuit configuration example of the multiplexer 10L illustrated in FIG. 8, and includes the low pass filter 11L and the high pass filter 12L.

The low pass filter 11L includes series arm circuits S1B and S2B, and a parallel arm circuit P1B. The series arm circuit S1B has the inductor L2 and a capacitor C5 connected in parallel to each other. The series arm circuit S2B has the inductor L3 and a capacitor C6 connected in parallel to each other. The series arm circuits S1B and S2B are connected in series to each other in a path connecting the input/output terminal T1 (common terminal 100) and the input/output terminal T3 (input/output terminal 110). The above-described two series arm circuits S1B and S2B each configure an LC parallel resonance circuit.

The parallel arm circuit P1B is connected between a connection node of the series arm circuits S1B and S2B and the ground, and includes an inductor L4, capacitors C7 and C8, and the switch SW1. The inductor L4 and the capacitor C8 are connected in series between the above-described connection node and the ground to configure an LC series resonance circuit. The capacitor C7 and the switch SW1 are connected in series between a connection node of the inductor L4 and the capacitor C8 and the ground, and configure a first impedance variable circuit.

In the low pass filter 11L, the wiring A which is connected to the input/output terminal T1, the inductor L2, and the capacitor C5 and which configures one end portion region of the first path, the wiring B which is connected to the input/output terminal T3, the inductor L3, and the capacitor C6 and which configures another end portion region of the first path, and the wiring C which is connected to the capacitor C7 and the switch SW1 and which configures a partial region of the second path are formed in the multilayer substrate in which the plurality of dielectric layers are stacked. The wiring A and the wiring B of the low pass filter 11L are formed in a dielectric layer different from a dielectric layer in which the wiring C is formed, and when the multilayer substrate is viewed in a plan view, the wiring A and the wiring B do not overlap with the wiring C. According to this configuration, it is possible to suppress the occurrence of unnecessary electromagnetic field coupling between the wiring A and the wiring B and the wiring C, so that low transmission loss in the pass band and a high attenuation in the attenuation band of the low pass filter 11L can be secured.

The high pass filter 12L includes series arm circuits S1C and S2C, and a parallel arm circuit P1C. The series arm circuit S1C includes the capacitor C1 which is connected in series. The series arm circuit S2C includes the capacitor C2 which is connected in series. The series arm circuits S1C and S2C are connected in series to each other in a path connecting the input/output terminal T1 (common terminal 100) and the input/output terminal T2 (input/output terminal 120).

The parallel arm circuit P1C is connected between a connection node of the series arm circuits S1C and S2C and the ground, and includes the inductor L1, the capacitors C3 and C4, and the switch SW2. The inductor L1 and the capacitor C4 are connected in series between the connection node and the ground, and configure an LC series resonance circuit. The capacitor C3 and the switch SW2 are connected in series between a connection node between the inductor L1 and the capacitor C4 and the ground, and configures a second impedance variable circuit.

In the high pass filter 12L, the wiring A which is connected to the input/output terminal T1 and the capacitor C1 and which configures one end portion region of the first path, the wiring B which is connected to the input/output terminal T2 and the capacitor C2 and which configures another end portion region of the first path, and the wiring C which is connected to the capacitor C3 and the switch SW2 and which configures a partial region of the second path are formed in the multilayer substrate in which a plurality of dielectric layers are stacked. The wiring A and the wiring B of the high pass filter 12L are formed in a dielectric layer different from a dielectric layer on which the wiring C is formed, and when the multilayer substrate is viewed in a plan view, the wiring A and the wiring B do not overlap with the wiring C. According to this configuration, it is possible to suppress the occurrence of unnecessary electromagnetic field coupling between the wiring A and the wiring B and the wiring C, so that low transmission loss in the pass band and a high attenuation in the attenuation band of the high pass filter 12L can be secured. Therefore, it is possible to provide the bandpass characteristic variable multiplexer 10L excellent in a transmission characteristic.

In this example, the low pass filter 11L is a first filter, the high pass filter 12L is a second filter, the input/output terminal 110 is a third input/output terminal, and the input/output terminal 120 is a fourth input/output terminal. Further, the low band group is the first frequency band group, and the high band group is the second frequency band group.

Figure 9B:
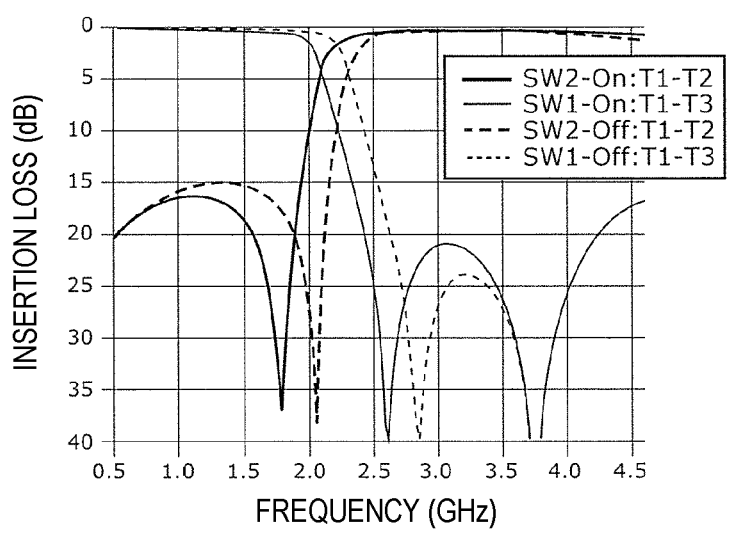
FIG. 9B is a graph illustrating a bandpass characteristic of the multiplexer according to the third example.

FIG. 9B is a graph illustrating the bandpass characteristic of the multiplexer 10L according to the third example. This figure illustrates (1) a bandpass characteristic of the high pass filter 12L when the switch SW2 is rendered conductive (thick solid line), (2) a bandpass characteristic of the low pass filter 11L when the switch SW1 is rendered conductive (thin solid line), (3) a bandpass characteristic of the high pass filter 12L when the switch SW2 is rendered non-conductive (thick broken line), and (4) a bandpass characteristic of the low pass filter 11L when the switch SW1 is rendered conductive (thin broken line).

As illustrated in FIG. 9B, in the low pass filter 11L, since the capacitor C7 is connected in series to the switch SW1, even when the switch SW1 is conductive (ON), the parallel arm circuit P1B becomes an LC series resonance circuit of a parallel combined capacitor of the capacitors C7 and C8 and the inductor L4. This LC parallel resonance of the LC series resonance circuit and the series arm circuits S1B and S2B generates two attenuation poles (thin solid line in FIG. 9B). On the other hand, when the switch SW1 becomes non-conductive (OFF), the parallel arm circuit P1B becomes an LC series resonance circuit of the inductor L4 and the capacitor C8, and has a resonance point on the higher frequency side than a resonance point at the time when the switch SW1 is conductive, so that the attenuation pole shifted to the higher frequency side is generated than that at the time when the switch SW1 is conductive (thin broken line in FIG. 9B). Therefore, the insertion loss on the pass band high-pass side of the low pass filter 11L is reduced.

Further, as illustrated in FIG. 9B, in the high pass filter 12L, since the capacitor C3 is connected in series to the switch SW2, even when the switch SW2 is conductive (ON), the parallel arm circuit P1C becomes an LC series resonance circuit of the parallel combined capacitor of the capacitors C3 and C4 and the inductor L1. This LC series resonance circuit generates one attenuation pole (thick solid line in FIG. 9B). On the other hand, when the switch SW2 becomes non-conductive (OFF), the parallel arm circuit P1C becomes an LC series resonance circuit of the inductor L1 and the capacitor C4, and has a resonance point at the higher frequency side than a resonance point at the time when the switch SW2 is conductive, so that the attenuation pole shifted to the higher frequency side is generated than that at the time when the switch SW2 is conductive (thick broken line in FIG. 9B). Therefore, the attenuation of the attenuation band of the high pass filter 12L corresponding to the pass band of the low pass filter 11L is improved.

For example, as illustrated in FIG. 9B, when the switch SW1 is rendered non-conductive and the switch SW2 is rendered conductive, the pass band of the high pass filter 12L and the pass band of the low pass filter 11L are brought close to each other. On the other hand, when the switch SW1 is rendered conductive and the switch SW2 is rendered non-conductive, the pass band of the high pass filter 12L and the pass band of the low pass filter 11L are moved away from each other. In this case, the switch SW1 is rendered conductive and the SW2 is rendered non-conductive, which makes the isolation between the high pass filter 12L and the low pass filter 11L be improved.

In the multiplexer 10L having the characteristics as described above, for example, in the case of the CA mode of (1) the Band 3 and the Band 40, the switches SW1 and SW2 are rendered conductive. Thus, the pass bands of the high pass filter 12L and the low pass filter 11L are both shifted to the low frequency side. Conversely, in the case of the CA mode of (2) the Band 1 and the Band 7, the switches SW1 and SW2 are rendered non-conductive. Thus, the pass bands of the high pass filter 12L and the low pass filter 11L are both shifted to the high frequency side. In addition, in the case of the CA mode of (3) the Band 3 and the Band 7, the switch SW1 is rendered conductive and the switch SW2 is rendered non-conductive. Thus, the pass band of the high pass filter 12L is shifted to the high frequency side, and the pass band of the low pass filter 11L is shifted to the low frequency side. In addition, in a case of the CA mode of (4) the Band 1 and the Band 40, the switch SW1 is rendered non-conductive and the switch SW2 is rendered conductive. Thus, the pass band of the high pass filter 12L is shifted to the low frequency side, and the pass band of the low pass filter 11L is shifted to the high frequency side.

Figure 10A:
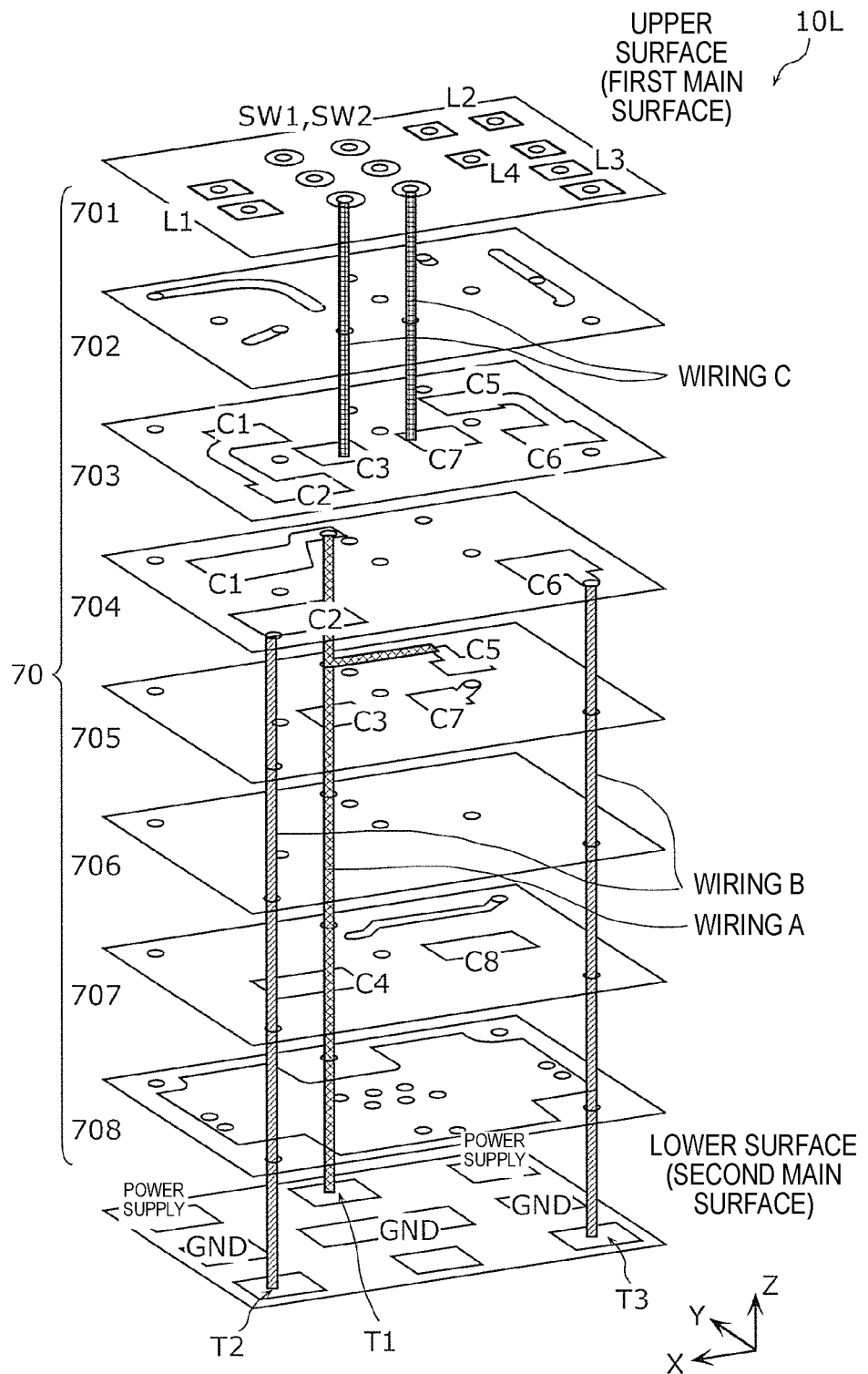
FIG. 10A is a perspective view illustrating a mounting structure of the multiplexer according to the third example.
Figure 10B:
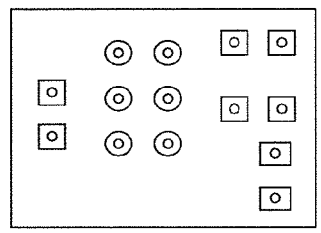
FIG. 10B is a stacking diagram illustrating a conductor pattern of each layer configuring the multiplexer according to the third example.
Figure 10B:
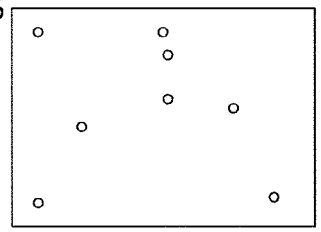
Figure 10B:
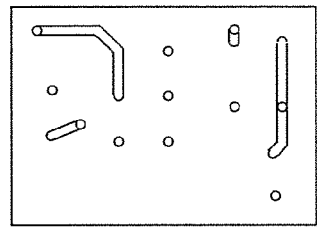
Figure 10B:
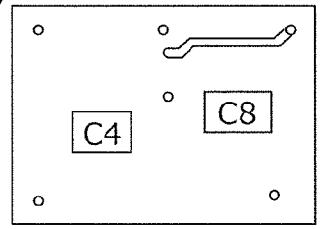
Figure 10B:
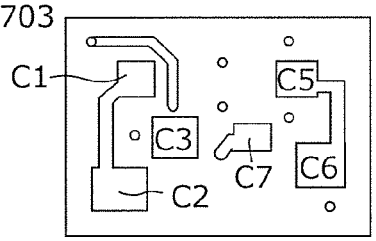
Figure 10B:
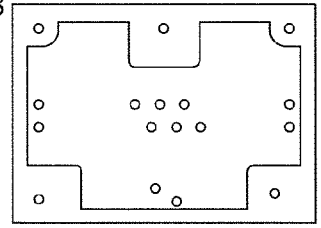
Figure 10B:
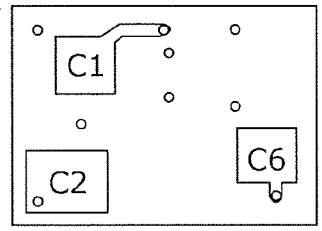
Figure 10B:
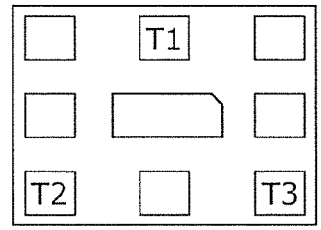
Figure 10B:
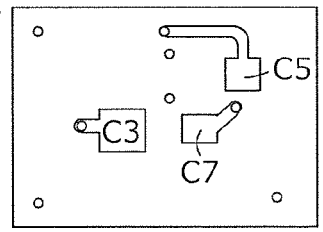

FIG. 10A is a perspective view illustrating a mounting structure of the multiplexer 10L according to the third example. FIG. 10B is a stacking diagram illustrating a conductor pattern of each layer configuring the multiplexer 10L according to the third example. FIG. 10A illustrates the arrangement relationship of each of the circuit elements and wirings configuring the multiplexer 10L according to the third example formed in the multilayer substrate 70.

The multilayer substrate 70 is a multilayer body in which eight dielectric layers 701 to 708 having a conductor pattern formed thereon is stacked in a direction perpendicular to the main surface of the multilayer substrate 70 (Z-axis direction in FIG. 10B). Note that the number of dielectric layers in the multilayer substrate 70 is not limited to eight, and may be any number equal to or greater than two.

The inductors L1 to L4 are formed in the dielectric layer 701 and are formed on the upper surface (first main surface) of the multilayer substrate 70. In addition, the capacitors C1, C2, C3, C5, C6, and C7 are formed in dielectric layers 703 and 704. Thus, the wiring C is formed in the dielectric layers 701 to 702. The dielectric layers 703 and 704 are layers lower than the dielectric layer 701 and upper than the dielectric layer 708. Note that the capacitors C1, C2, C3, C5, C6, and C7 are not limited to being formed in the dielectric layers 703 and 704, and may be formed in a layer lower than the dielectric layer 701 and upper than the dielectric layer 708.

Further, the capacitors C4 and C8 are formed in the dielectric layer 707.

The input/output terminals T1, T2, and T3 are formed in the dielectric layer 708, and are formed on a lower surface (second main surface) of the multilayer substrate 70. Thus, the wiring A and the wiring B are formed in the dielectric layers 704 to 708. That is, the wiring A and the wiring B and the wiring C are formed in different layers.

Furthermore, when the multilayer substrate 70 is viewed in a plan view (when viewed from the Z-axis direction), the wiring A and the wiring B do not overlap with the wiring C.

According to the above configuration, it is possible to suppress the occurrence of unnecessary electromagnetic field coupling between the wiring A and the wiring B and the wiring C. As a result, in the multiplexer 10L, it is possible to suppress the occurrence of an unintended impedance change, so that low transmission loss in the pass band and a high attenuation in the attenuation band can be secured. Further, the first impedance variable circuit and the second impedance variable circuit are arranged in the parallel arm circuits P1B and P1C. Therefore, it is possible to prevent the transmission loss in the first path in which the series arm circuits S1B, S2B, S1C, and S2C are arranged from deteriorating due to the influence of the ON resistance of the switches SW1 and SW2 caused by the first impedance variable circuit and the second impedance variable circuit.

The input/output terminals T1, T2, and T3 are arranged on the lower surface (second main surface) of the multilayer substrate 70, and the switches SW1 and SW2 are arranged on the upper surface (first main surface) of the multilayer substrate 70. Accordingly, the wiring A and the wiring B connected to the input/output terminals T1, T2, or T3 are arranged on the second main surface side of the multilayer substrate 70, and the wiring C arranged in the second path in which the first impedance variable circuit and the second impedance variable circuit are arranged can be arranged on the first main surface side of the multilayer substrate 70. Therefore, even when the wiring A and wiring B and wiring C are arranged in different dielectric layers, the wiring length of each wiring can be shortened, so that the transmission loss of the multiplexer 10L can be reduced.

Further, since the switches SW1 and SW2 which are variable elements configuring the first impedance variable circuit and the second impedance variable circuit are formed on the first main surface, the switches SW1 and SW2 can be configured by surface mount type elements. Therefore, the on-resistance can be reduced as compared with the switch element configured by using each of the dielectric layers of the multilayer substrate 70. In addition, in the case where the first impedance variable circuit and the second impedance variable circuit are configured by a variable inductor or a variable capacitor as illustrated in of FIGS. 1BB and 1BE, the Q value can be increased as compared with a variable inductor or a variable capacitor configured by using each of the dielectric layers of the multilayer substrate 70. Accordingly, it is possible to improve the bandpass characteristic of the multiplexer 10L.

As illustrated in FIG. 9A, in the multiplexer 10L according to the third example, each of the series arm circuits S1B, S2B, S1C, and S2C and the parallel arm circuits P1B and P1C includes one or more capacitors. As illustrated in FIG. 10B, the capacitor C5 of the series arm circuit S1B and the capacitor C6 of the series arm circuit S2B may be not overlapping with the capacitors C7 and C8 of the parallel arm circuit P1B in the above plan view. In addition, the capacitor C1 of the series arm circuit S1C and the capacitor C2 of the series arm circuit S2C may be not overlapping with the capacitors C3 and C4 of the parallel arm circuit P1C.

Accordingly, it is possible to suppress the generation of unnecessary parasitic capacitance between the series arm circuits S1B and S2B and the parallel arm circuit P1B and between the series arm circuits S1C and S2C and the parallel arm circuit P1C. Thus, in the multiplexer 10L, it is possible to suppress the occurrence of an unintended impedance change, lower transmission loss in the pass band and a higher attenuation in the attenuation band can be secured.

As described above, in the multiplexer 10L for performing the CA between the so-called low band group and the high band group, even when the frequency band to be selected is changed, it is possible to suppress deterioration of an insertion loss or demultiplexing characteristic while maintaining a lower transmission loss in the pass band and a higher attenuation in the attenuation band.

[3.3 Radio Frequency Front End Circuit According to Modification]

Figure 11A:
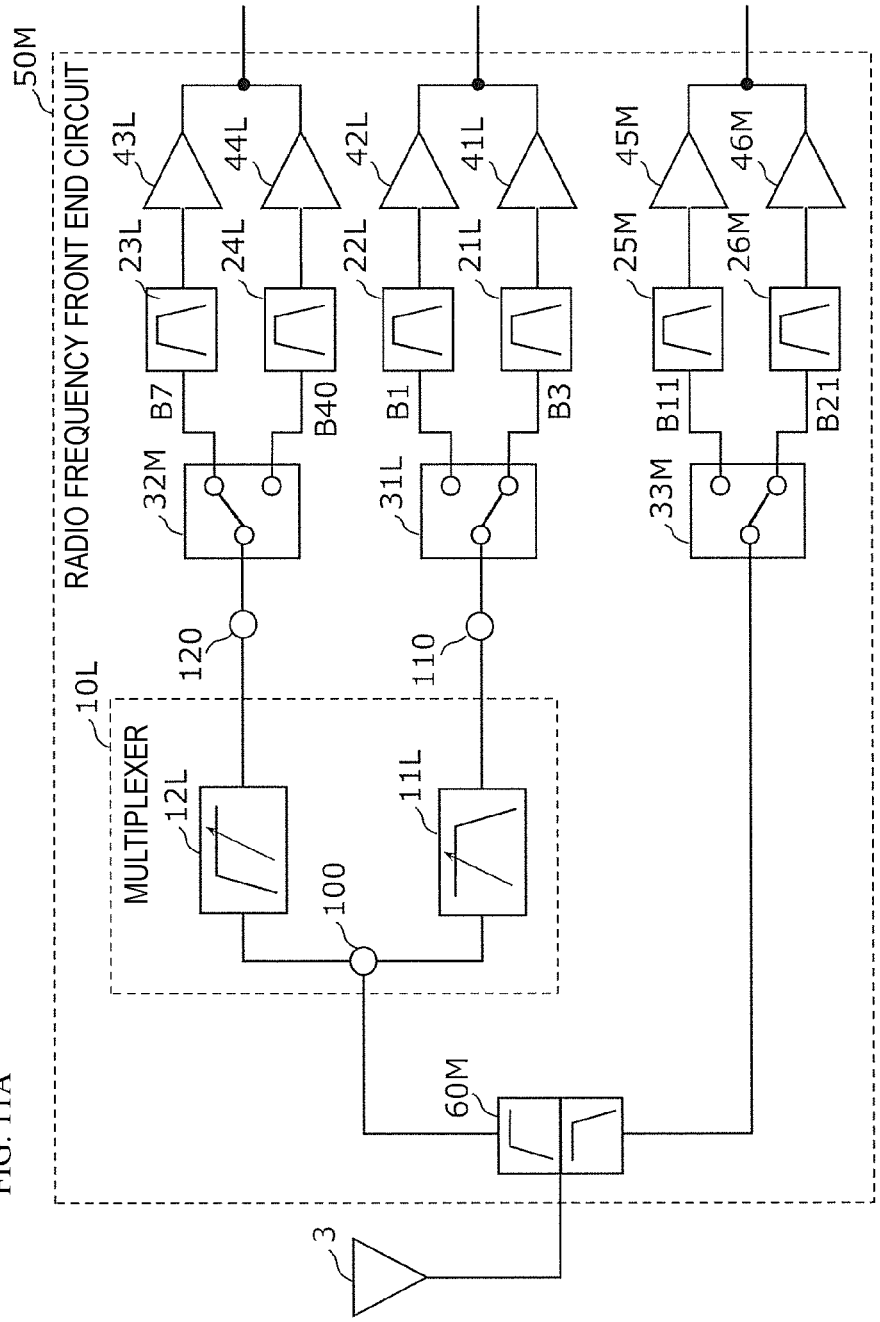
FIG. 11A is a circuit configuration diagram of a radio frequency front end circuit and its peripheral circuit according to a first modification of the third embodiment.

FIG. 11A is a circuit configuration diagram of a radio frequency front end circuit 50M and a peripheral circuit thereof according to a first modification of the third embodiment. As illustrated in this figure, the radio frequency front end circuit 50M is a reception system front end circuit and includes a diplexer 60M, the multiplexer 10L, the switch 31L and switches 32M and 33M, the filters 21L, 22L, 23L, 24L, filters 25M and 26M, and the reception amplifiers 41L, 42L, 43L, 44L and reception amplifiers 45M and 46M. The radio frequency front end circuit 50M according to the first modification differs from the radio frequency front end circuit 50L according to the third embodiment in that (1) the diplexer 60M is arranged between the antenna element 3 and the multiplexer 10L, and that (2) a signal path for transmitting a third frequency band group is added. Hereinafter, for the radio frequency front end circuit 50M according to the first modification, the same configuration as that of the radio frequency front end circuit 50L according to the third embodiment will not be described, and a different configuration will be mainly described.

The switch 32M has a common terminal and two selection terminals, and the common terminal is connected to the input/output terminal 120. The switch 32M is an SPDT type switch circuit capable of connecting the common terminal and any one of the two selection terminals.

The diplexer 60M has a high pass filter and a low pass filter, a common terminal is connected to the antenna element 3, an output end of the high pass filter is connected to the common terminal 100 of the multiplexer 10L, and an output end of the low pass filter is connected to the switch 33M. The high pass filter of the diplexer 60M is a high pass type filter which allows passing of the Bands 1, 3, 7, and 40, and attenuates the Band 11 (1475.9 to 1495.9 MHz) and the Band 21 (1495.9 to 1510.9 MHz). In addition, the low pass filter of the diplexer 60M is a low pass type filter which attenuates the Bands 1, 3, 7, and 40, and allows passing of the Bands 11 and 21.

Note that the high pass filter of the diplexer 60M is a high pass type filter which allows passing of the Bands 11, 21, 3, 1, 40, and 7, and attenuates the low band group (699 to 960 MHz, for example, including Band 20 (transmission band: 832 to 862 MHz, reception band: 791 to 821 MHz)), and the low pass filter may be a low pass type filter which attenuates the Bands 11, 21, 3, 1, 40, and 7, and allows passing of the above-described low band group (for example, including Band 20).

The filter 25M is a band pass filter which is connected to one selection terminal of the switch 33M and in which the Band 11 is a pass band. The filter 26M is a band pass filter which is connected to another selection terminal of the switch 33M and in which the Band 21 is a pass band.

The reception amplifier 45M is connected to the filter 25M, and the reception amplifier 46M is connected to the filter 26M. Each of the reception amplifiers 45M and 46M is a low-noise amplifier configured by, for example, a transistor or the like.

According to the above configuration, in the multiplexer 10L, the occurrence of an unintended impedance change can be suppressed, so that it is possible to provide the radio frequency front end circuit 50M in which low transmission loss in the pass band and a high attenuation in the attenuation band are secured.

Figure 11B:
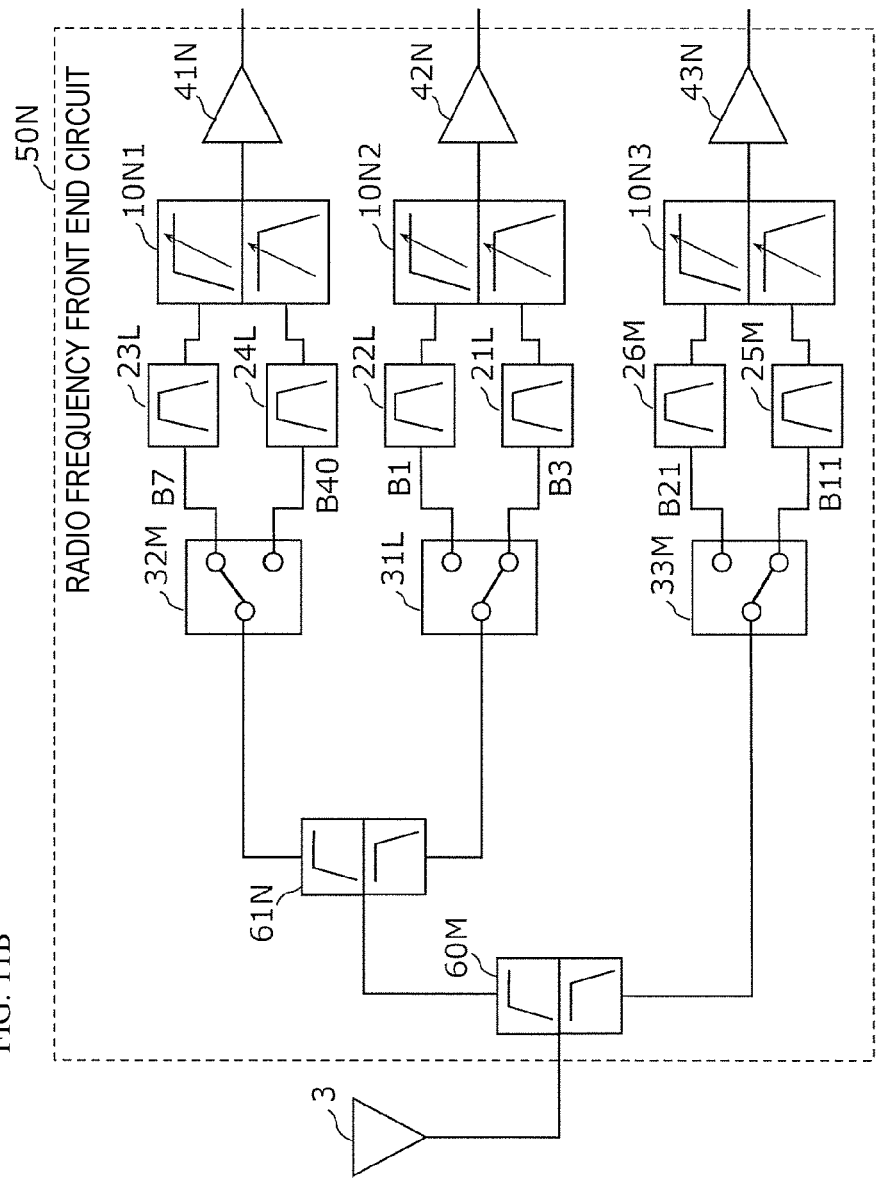
FIG. 11B is a circuit configuration diagram of a radio frequency front end circuit and its peripheral circuit according to a second modification of the third embodiment.

FIG. 11B is a circuit configuration diagram of a radio frequency front end circuit 50N and a peripheral circuit thereof according to a second modification of the third embodiment. As illustrated in this figure, the radio frequency front end circuit 50N is a reception system front end circuit, and includes the diplexer 60M and a diplexer 61N, multiplexers 10N1, 10N2, and 10N3, the switches 31L, 32M, and 33M, the filters 21L, 22L, 23L, 24L, 25M, and 26M, and reception amplifiers 41N, 42N, and 43N. The radio frequency front end circuit 50N according to the second modification differs from the radio frequency front end circuit 50M according to the first modification in the arrangement position of the multiplexers 10N1 to 10N3. Hereinafter, for the radio frequency front end circuit 50M according to the second modification, the same configuration as that of the radio frequency front end circuit 50M according to the first modification will not be described, and a different configuration will be mainly described.

The switch 32M has the common terminal and two selection terminals, and the common terminal is connected to an output end of a high pass filter of the diplexer 61N. The switch 32M is an SPDT type switch circuit capable of connecting the common terminal and any one of the two selection terminals.

The switch 33M has a common terminal and two selection terminals, and the common terminal is connected to an output end of a low pass filter of the diplexer 60M. The switch 33M is an SPDT type switch circuit capable of connecting the common terminal and any one of the two selection terminals.

The diplexer 60M has a high pass filter and the low pass filter, a common terminal is connected to the antenna element 3, an output end of the high pass filter is connected to a common terminal of the diplexer 61N, and an output end of the low pass filter is connected to the switch 33M. The high pass filter of the diplexer 60M is a high pass type filter which allows passing of the Bands 1, 3, 7, and 40 and attenuates the Band 11 and the Band 21. Further, the low pass filter of the diplexer 60M is a low pass type filter which attenuates the Bands 1, 3, 7, and 40 and allows passing of the Band 11 and the Band 21.

The diplexer 61N has the high pass filter and a low pass filter, an output end of the high pass filter is connected to the common terminal of the switch 32M, and an output end of the low pass filter is connected to the common terminal of the switch 31L. The high pass filter of the diplexer 61N is a high pass type filter which allows passing of the Bands 7 and 40 and attenuates the Bands 1 and 3. Further, the low pass filter of the diplexer 61N is a low pass type filter which attenuates the Bands 7 and 40 and allows passing of the Bands 1 and 3.

The multiplexer 10N1 has the same configuration as that of the multiplexer 10L according to this embodiment. A high pass filter of the multiplexer 10N1 is a high pass type filter of bandpass characteristic variable type which allows passing of the Band 7 and attenuates the Band 40. A low pass filter of the multiplexer 10N1 is a low pass type filter of bandpass characteristic variable type which allows passing of the Band 7 and attenuates the Band 40.

The multiplexer 10N2 has the same configuration as that of the multiplexer 10L according to this embodiment. A high pass filter of the multiplexer 10N2 is a high pass type filter of bandpass characteristic variable type which allows passing of the Band 1 and attenuates the Band 3. A low pass filter of the multiplexer 10N2 is a low pass filter of bandpass characteristic variable type which attenuates the Band 1 and allows passing of the Band 3.

The multiplexer 10N3 has the same configuration as that of the multiplexer 10L according to this embodiment. A high pass filter of the multiplexer 10N3 is a high pass type filter of bandpass characteristic variable type which allows passing of the Band 21 and attenuates the Band 11. A low pass filter of the multiplexer 10N3 is a low pass type filter of bandpass characteristic variable type which attenuates the Band 21 and allows passing of the Band 11.

The reception amplifier 41N is connected to a common terminal of the multiplexer 10N1, the reception amplifier 42N is connected to a common terminal of the multiplexer 10N2, and the reception amplifier 43N is connected to a common terminal of the multiplexer 10N3. Each of the reception amplifiers 41N, 42N, and 43N is a low-noise amplifier configured by, for example, a transistor or the like.

According to the configuration described above, in the multiplexers 10N1 to 10N3, the occurrence of an unintended impedance change can be suppressed, so that it is possible to provide the radio frequency front end circuit 50N in which a low transmission loss in the pass band and a high attenuation in the attenuation band are secured.

Figure 11C:
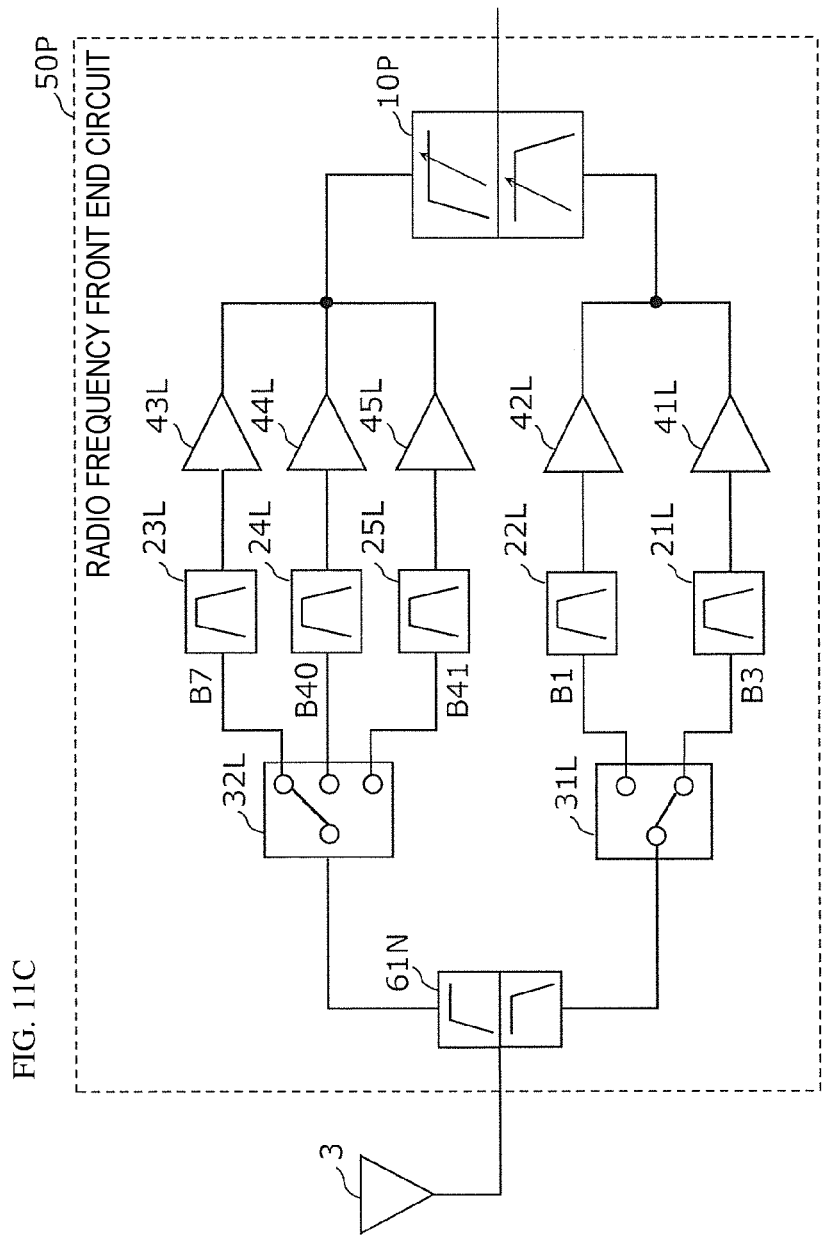
FIG. 11C is a circuit configuration diagram of a radio frequency front end circuit and its peripheral circuit according to a third modification of the third embodiment.

FIG. 11C is a circuit configuration diagram of a radio frequency front end circuit 50P and a peripheral circuit thereof according to a third modification of the third embodiment. As illustrated in this figure, the radio frequency front end circuit 50P is a reception system front end circuit, and includes the diplexer 61N, a multiplexer 10P, the switches 31L and 32L, the filters 21L, 22L, 23L, 24L, and 25L, and the reception amplifiers 41L, 42L, 43L, 44L, and 45L. The radio frequency front end circuit 50P according to the third modification differs from the radio frequency front end circuit 50L according to the third embodiment in that (1) the diplexer 61N is added, and (2) the arrangement position of the multiplexer 10P. Hereinafter, for the radio frequency front end circuit 50P according to the third modification, the same configuration as that of the radio frequency front end circuit 50L according to the third embodiment will not be described, and a different configuration will be mainly described.

The diplexer 61N includes a high pass filter and a low pass filter, a common terminal is connected to the antenna element 3, an output end of the high pass filter is connected to a common terminal of the switch 32L, and an output end of the low pass filter is connected to a common terminal of the switch 31L. The high pass filter of the diplexer 61N is a high pass type filter which allows passing of the Bands 7, 40, and 41 and attenuates the Bands 1 and 3. Further, the low pass filter of the diplexer 61N is a low pass type filter which attenuates the Bands 7, 40, and 41, and allows passing of the Bands 1 and 3.

The multiplexer 10P has the same structure as that of the multiplexer 10L according to this embodiment. A high pass filter of the multiplexer 10P is a high pass type filter of bandpass characteristic variable type which allows passing of the Bands 7, 40, and 41 and attenuates the Bands 1 and 3. A low pass filter of the multiplexer 10P is a low pass type filter of bandpass characteristic variable type which attenuates the Bands 7, 40, and 41 and allows passing of the Bands 1 and 3.

According to the configuration described above, in the multiplexer 10P, the occurrence of an unintended impedance change can be suppressed, so that it is possible to provide the radio frequency front end circuit 50P in which a low transmission loss in the pass band and a high attenuation in the attenuation band are secured.

Other Embodiments

Although the radio frequency circuit, the multiplexer, the radio frequency front end circuit, and the communication apparatus according to the present disclosure have been described above using the embodiments, the examples, and the modifications, the present disclosure is not limited to the above embodiments, examples and modifications. Other embodiments which are realized by combining any constituent elements in the above embodiments, examples and modifications, and variations which can be obtained by applying various changes on the above-described embodiments by a person skilled in the art without necessarily departing from the gist of the present disclosure, and various devices incorporating the radio frequency circuit, the multiplexer, the radio frequency front end circuit and the communication apparatus according to the present disclosure are also included in the present disclosure.

Note that the low band group and the high band group described in the above embodiment refer to a band group having a relatively low frequency and a band group having a relatively high frequency, respectively.

Therefore, the circuit configuration described in the above embodiment can be applied, even when the combination of the low band group/high band group is a combination of any two frequency band groups (which may be the same frequency band group) of the following (1) to (5).

(1) LB (699 to 960 MHz)
(2) MLB (1427 to 1511 MHz)
(3) MB (1710 to 2200 MHz)
(4) HB (2300 to 2690 MHz)
(5) UHB (3300 to 5000 MHz)

For example, the following combinations (A) to (D) may be used.

(A) LB/MB
(B) MLB/MB
(C) HB/UHB
(D) UHB/UHB

Note that the frequency band (band) belonging to each frequency band group may be two or more.

In addition, in the above description, the diplexer having two frequency band groups to be demultiplexed is described as an example of a multiplexer, three or more frequency band groups to be demultiplexed may be used. For example, a multiplexer which demultiplexes LB/MLB/MB/HB may be used.

Additionally, for example, inductors and capacitors may be connected between the constituent elements in the radio frequency circuit according to the embodiment, the multiplexer, the radio frequency front end circuit, and the communication apparatus. Note that the inductor may also include a wiring inductor formed by a wiring interconnecting the constituent elements.

Further, although the radio frequency front end circuit according to the above embodiment has been described as an example of the reception system circuit, the transmission system circuit may also be used. In this case, a transmission amplifier circuit such as a power amplifier is arranged instead of a reception amplifier circuit. Furthermore, a radio frequency front end circuit including both a signal path for reception and a signal path for transmission may be used.

Additionally, although the configurations have been described in which the radio frequency circuit according to the first to third embodiments and the high pass filter and the low pass filter configuring the multiplexer each has one parallel arm circuit, a plurality of parallel arm circuits may be arranged. As such, three or more series arm circuits may be arranged. Since a plurality of parallel arm circuits and series arm circuits are provided, the number of attenuation poles in the filter pass characteristic can be increased, so that, for example, the steepness of the filter characteristic and the degree of freedom in design of the attenuation band are increased.

INDUSTRIAL APPLICABILITY

The present disclosure can be widely used for communication devices such as cellular phones or the like as a radio frequency circuit, a multiplexer, a radio frequency front end circuit, and a communication apparatus which are applicable to a multiband system.

REFERENCE SIGNS LIST

1. COMMUNICATION APPARATUS
2, 2A, 2B, 2C, 502A, 502B, 502C, 502D, 502E, 502F, 502G RADIO FREQUENCY CIRCUIT
3 ANTENNA ELEMENT
4 RF SIGNAL PROCESSING CIRCUIT (RFIC)
5 BASE BAND SIGNAL PROCESSING CIRCUIT (BBIC)
10, 10A, 10L, 10N1, 10N2, 10N3, 10P MULTIPLEXER
11, 11A, 11L LOW PASS FILTER
12, 12L HIGH PASS FILTER
21, 21L, 22, 22L, 23, 23L, 24, 24L, 25L, 25M, 26M FILTER
31, 31L, 32, 32L, 32M, 33M SWITCH
40, 40L, 46L AMPLIFIER CIRCUIT
41, 41L, 41N, 42, 42L, 42N, 43, 43L, 43N, 44L, 45L, 45M, 46M RECEPTION AMPLIFIER
50, 50L, 50M, 50N, 50P RADIO FREQUENCY FRONT END CIRCUIT
60, 60a, 60A, 60b, 60c, 60d, 60e, 60f, 61 IMPEDANCE VARIABLE CIRCUIT
60M, 60N, 61N DIPLEXER
70 MULTILAYER SUBSTRATE
100, 310, 320 COMMON TERMINAL
110, 120 INPUT/OUTPUT TERMINAL
311, 312, 321, 322, 323 SELECTION TERMINAL
701, 702, 703, 704, 705, 706, 707, 708, 70n DIELECTRIC LAYER
A1 ACOUSTIC WAVE RESONATOR
C1, C2, C21, C3, C4, C5, C6, C7, and C8 CAPACITOR
Cv, VC1, VC2 VARIABLE CAPACITOR
G1, G2, G3 GROUND PATTERN L1, L2, L21, L22, L23, L3, L4 INDUCTOR
Lv VARIABLE INDUCTOR
P1, P1A, P1B, P1C, P2 PARALLEL ARM CIRCUIT
S1, S1A, S1B, S1C, S2, S2A, S2B, S2C SERIES ARM CIRCUIT
SW, SW1, SW2 SWITCH
T1, T2, T3 INPUT/OUTPUT TERMINAL

The invention claimed is:

1. A radio frequency circuit comprising:
a multilayer substrate;
a first input/output terminal and a second input/output terminal on a surface of the multilayer substrate;
a first series arm circuit and a second series arm circuit in the multilayer substrate, the first series arm circuit and the second series arm circuit being connected in series in a first path, the first path connecting the first input/output terminal and the second input/output terminal;
a parallel arm circuit in a second path, the second path connecting a node on the first path and ground;
a first wiring in the multilayer substrate and connected to the first input/output terminal, the first wiring representing a first part of the first path;
a second wiring in the multilayer substrate and connected to the second input/output terminal, the second wiring representing a second part of the first path; and
a third wiring in the multilayer substrate, the third wiring representing a part of the second path, wherein:
the parallel arm circuit comprises a first impedance variable circuit configured to vary a transmission characteristic of a radio frequency signal between the first input/output terminal and the second input/output terminal,
the first wiring and the second wiring are in a different layer of the multilayer substrate than the third wiring, and
when the multilayer substrate is viewed in a plan view, the third wiring does not overlap with the first wiring and the second wiring.

2. The radio frequency circuit according to claim 1, wherein the parallel arm circuit comprises:
an LC series resonance circuit comprising an inductor and a capacitor connected in series between the node and ground.

3. The radio frequency circuit according to claim 1, wherein the parallel arm circuit comprises:
an acoustic wave resonator connected between the node and ground.

4. The radio frequency circuit according to claim 1, wherein:
the multilayer substrate comprises a first main surface and an opposing second main surface,
the first impedance variable circuit comprises a variable circuit element, the variable circuit element being a switch or a variable capacitor,
the variable circuit element is arranged on the first main surface, and
the first input/output terminal and the second input/output terminal are arranged on the second main surface.

5. The radio frequency circuit according to claim 1, wherein the first wiring connects the first input/output terminal and the first series arm circuit,
the second wiring connects the second input/output terminal and the second series arm circuit,
the first series arm circuit, the second series arm circuit, and the parallel arm circuit each comprise one or more capacitors, and
when the multilayer substrate is viewed in the plan view, the one or more capacitors of the first series arm circuit and the one or more capacitors of the second series arm circuit do not overlap with the one or more capacitors of the parallel arm circuit.

6. A multiplexer configured to simultaneously transmit radio frequency signals of a first frequency band or a second frequency band and a radio frequency signal of a third frequency band, the first and second frequency bands belonging to a first frequency band group and the third frequency band belonging to a second frequency band group, and configured to exclusively transmit radio frequency signals of the first frequency band and the second frequency band, the multiplexer comprising:
a first common terminal, a third input/output terminal, and a fourth input/output terminal;
a first filter comprising the radio frequency circuit according to claim 1, wherein the first common terminal is connected to the first input/output terminal, the third input/output terminal is connected to the second input/output terminal, a pass band of the first filter comprises the first frequency band group, and an attenuation band of the first filter comprises the second frequency band group; and
a second filter connected between the first common terminal and the fourth input/output terminal, wherein a pass band of the second filter comprises the second frequency band group, and an attenuation band of the second filter comprises the first frequency band group, wherein:
the first impedance variable circuit comprises a first switch, and
the pass band or the attenuation band of the first filter is configured to vary in accordance with an impedance change of the first impedance variable circuit.

7. The multiplexer according to claim 6, wherein:
the first frequency band group comprises the first frequency band and the second frequency band,
the second frequency band group comprises the third frequency band and a fourth frequency band,
the multiplexer is configured to: (1) exclusively transmit radio frequency signals of the first frequency band and the second frequency band, (2) exclusively transmit radio frequency signals of the third frequency band and the fourth frequency band, and (3) simultaneously transmit radio frequency signals of the first or second frequency band and the third or fourth frequency band,
the second filter comprises a second impedance variable circuit configured to vary a transmission characteristic of a radio frequency signal between the first common terminal and the fourth input/output terminal, and
the pass band or the attenuation band of the second filter is configured to vary in accordance with an impedance change of the second impedance variable circuit.

8. A radio frequency front end circuit comprising:
the multiplexer according to claim 6;
a third switch comprising a second common terminal, a first selection terminal, and a second selection terminal, the second common terminal being connected to the third input/output terminal;
a third filter connected to the first selection terminal, a pass band of the third filter comprising the first frequency band;
a fourth filter connected to the second selection terminal, a pass band of the fourth filter comprising the second frequency band;

a fifth filter connected to the fourth input/output terminal, a pass band of the fifth filter comprising the third frequency band;

a first amplifier circuit connected to the third filter and the fourth filter; and a second amplifier circuit connected to the fifth filter.

9. A radio frequency front end circuit comprising:

the multiplexer according to claim 7;

a third switch comprising a second common terminal, a first selection terminal, and a second selection terminal, the second common terminal being connected to the third input/output terminal;

a fourth switch comprising a third common terminal, a third selection terminal, and a fourth selection terminal, the third common terminal being connected to the fourth input/output terminal;

a third filter connected to the first selection terminal, a pass band of the third filter comprising the first frequency band;

a fourth filter connected to the second selection terminal, a pass band of the fourth filter comprising the second frequency band;

a fifth filter connected to the third selection terminal, a pass band of the fifth filter comprising the third frequency band;

a sixth filter connected to the fourth selection terminal, a pass band of the sixth filter comprising the fourth frequency band;

a first amplifier circuit connected to the third filter and the fourth filter; and a second amplifier circuit connected to the fifth filter and the sixth filter.

10. A communication apparatus comprising:

a radio frequency (RF) signal processing circuit configured to process a radio frequency signal received by an antenna; and the radio frequency front end circuit according to claim 8 configured to transmit the radio frequency signal between the antenna and the RF signal processing circuit.

* * * * *